US011095291B2

(12) United States Patent
Tripodi

(10) Patent No.: US 11,095,291 B2
(45) Date of Patent: Aug. 17, 2021

(54) TIME MEASUREMENT CIRCUIT, SYSTEM HAVING A PWM SIGNAL GENERATOR CIRCUIT AND A TIME MEASUREMENT CIRCUIT, AND CORRESPONDING INTEGRATED CIRCUIT

(71) Applicant: STMicroelectronics S.r.l., Agrate Brianza (IT)

(72) Inventor: Domenico Tripodi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/078,945

(22) Filed: Oct. 23, 2020

(65) Prior Publication Data

US 2021/0126643 A1 Apr. 29, 2021

(30) Foreign Application Priority Data

Oct. 29, 2019 (IT) ........................ 102019000019914

(51) Int. Cl.
| | | |
|---|---|---|
| *H03L 7/081* | (2006.01) | |
| *G06F 1/08* | (2006.01) | |
| *H03L 7/24* | (2006.01) | |
| *H03K 7/08* | (2006.01) | |

(52) U.S. Cl.
CPC ............. *H03L 7/0814* (2013.01); *G06F 1/08* (2013.01); *H03K 7/08* (2013.01); *H03L 7/24* (2013.01)

(58) Field of Classification Search
CPC ............ H03L 7/0814; H03L 7/24; G06F 1/08
See application file for complete search history.

(56) References Cited

U.S. PATENT DOCUMENTS

| | | |
|---|---|---|
| 7,206,343 B2 | 4/2007 | Pearce |
| 7,791,387 B1 | 9/2010 | Wong |
| 2010/0127789 A1 | 5/2010 | Kenly et al. |
| 2012/0154005 A1 | 6/2012 | Frederiksen et al. |
| 2013/0271196 A1 | 10/2013 | Cao et al. |
| 2015/0171843 A1 | 6/2015 | Kim |
| 2018/0017944 A1 | 1/2018 | Lee et al. |
| 2019/0245528 A1 | 8/2019 | Reitsma |

*Primary Examiner* — Patrick O Neill
(74) *Attorney, Agent, or Firm* — Seed Intellectual Property Law Group LLP

(57) ABSTRACT

A time measurement includes a multiphase clock generator and a phase sampling circuit. The multiphase clock generator generates a sequence of a given number n of phase shifted clock phases, wherein one of the phase shifted clock phases represents a reference clock signal. The phase sampling circuit is configured to generate a phase value indicative of a number of fractions 1/n of the clock period of the clock phases elapsed between an edge of the reference clock signal and an instant when an asynchronous event signal is set. The phase sampling circuit includes first through fourth sub-circuits, which respectively generate or determine first through fourth control signals.

20 Claims, 14 Drawing Sheets

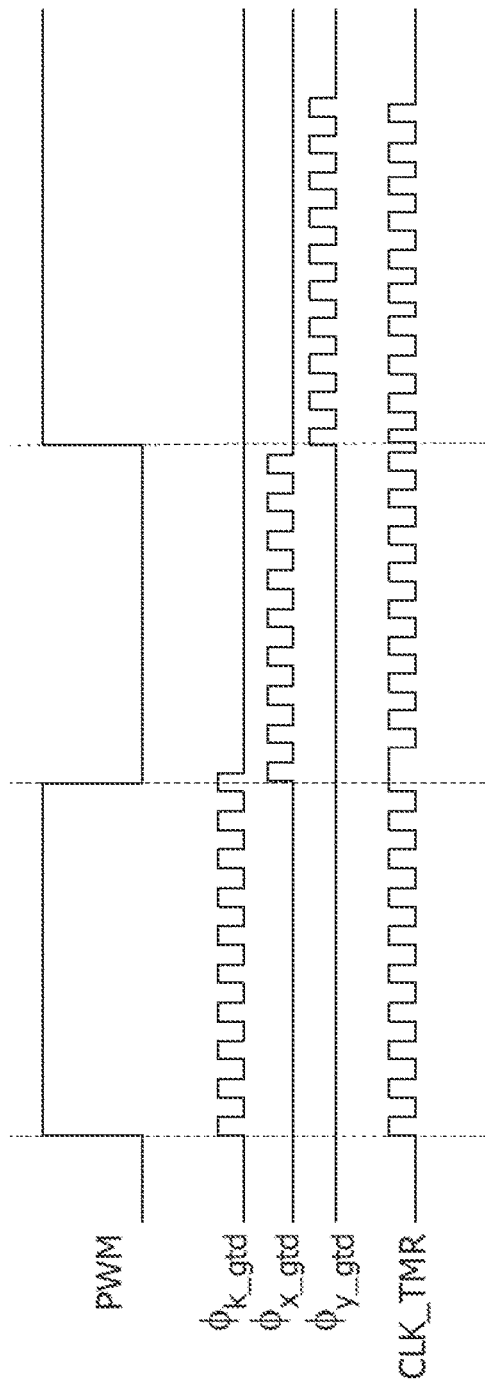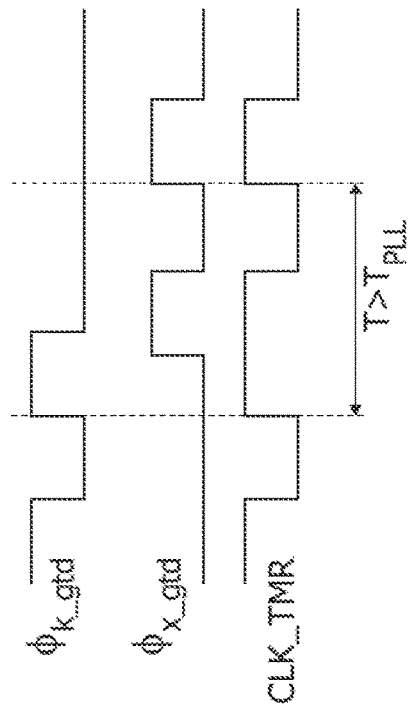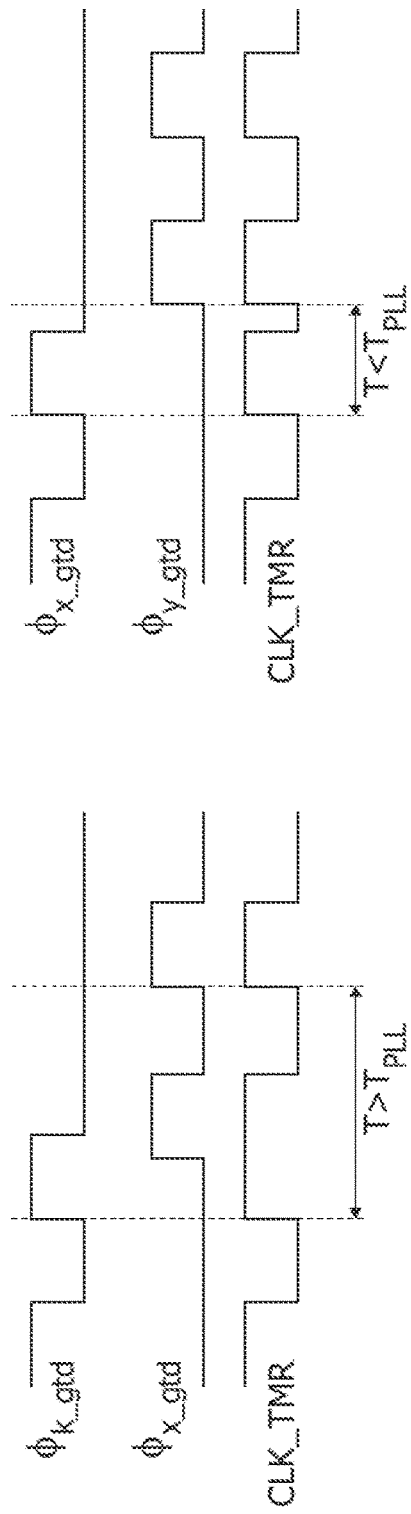

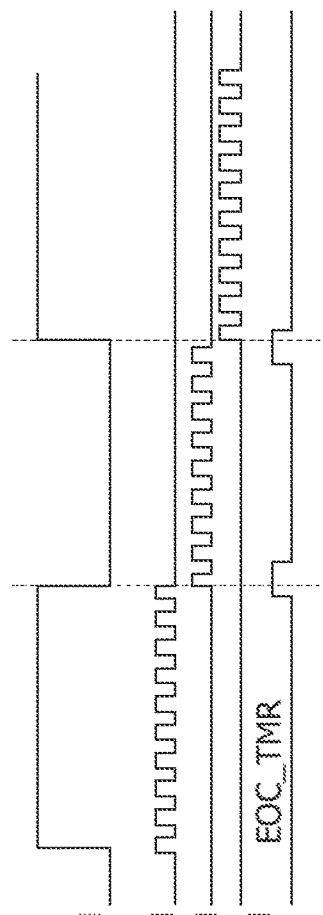
FIG. 12A
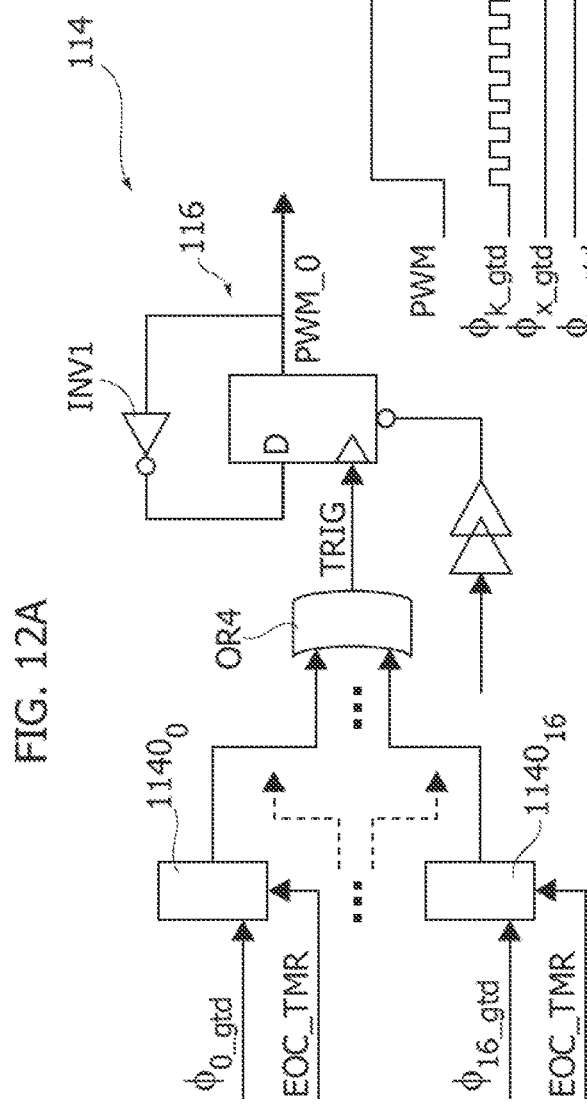
FIG. 12B
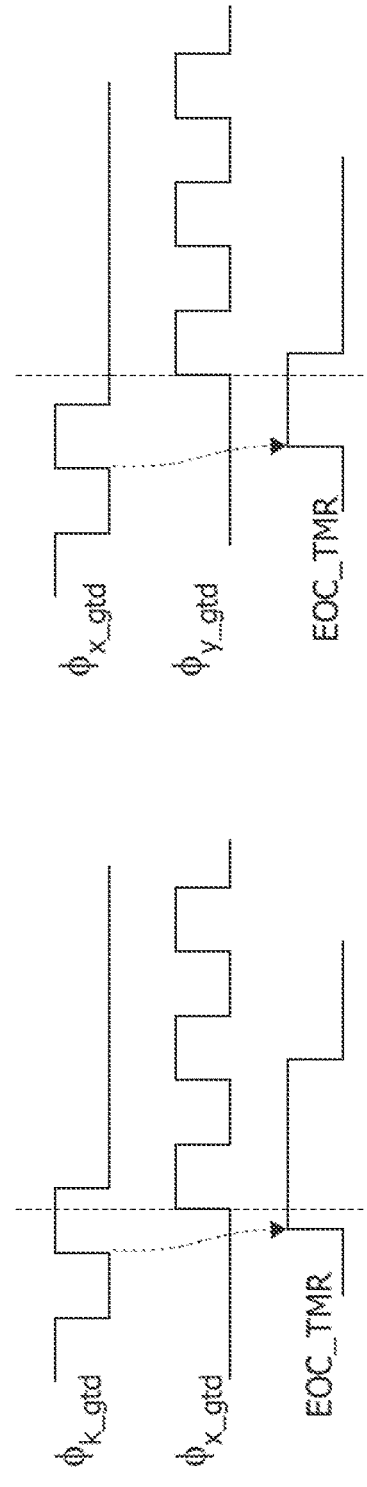
FIG. 12C
FIG. 12D

FIG. 16

```
p_async_fllng : process(CLK_TMR, s_rst_dump)
begin
  if (s_rst_dump = '1') then
    ASYNCH_evnt_ret_fl         <= '0';
  elsif (CLK_TMR'event and CLK_TMR = '0') then
    ASYNCH_evnt_ret_fl         <= CMP_ASYNCH_evnt;
  end if;
end process;

p_asynd_rsng : process(CLK_TMR, s_rst_dump)
begin
  if (s_rst_dump = '1') then
    ASYNCH_evnt_ret_rs         <= '0';
  elsif (CLK_TMR'event and CLK_TMR = '1') then
    ASYNCH_evnt_ret_rs         <= CMP_ASYNCH_evnt;
  end if;
end process;
```

FIG. 17

```
p_counter_dmp : process(CLK_TMR, s_rst_dump)
begin
  if (s_rst_dump = '1') then
    s_tmrcnt_dmp               <= (others => '0');
    s_end_dump                 <= '0';
  elsif (CLK_TMR'event and CLK_TMR = '1') then
    if (ASYNCH_evnt_ret_rs = '1' and s_end_dump = '0' and ASYNCH_evnt_ret_fl = '1') then
      s_tmrcnt_dmp             <= (TMR_CRS - 1);
      s_end_dump               <= '1';
    elsif (ASYNCH_evnt_ret_rs = '0' and s_end_dump = '0' and ASYNCH_evnt_ret_fl = '1') then
      s_tmrcnt_dmp             <= TMR_CRS;
      s_end_dump               <= '1';
    end if;
  end if;
end process;
```

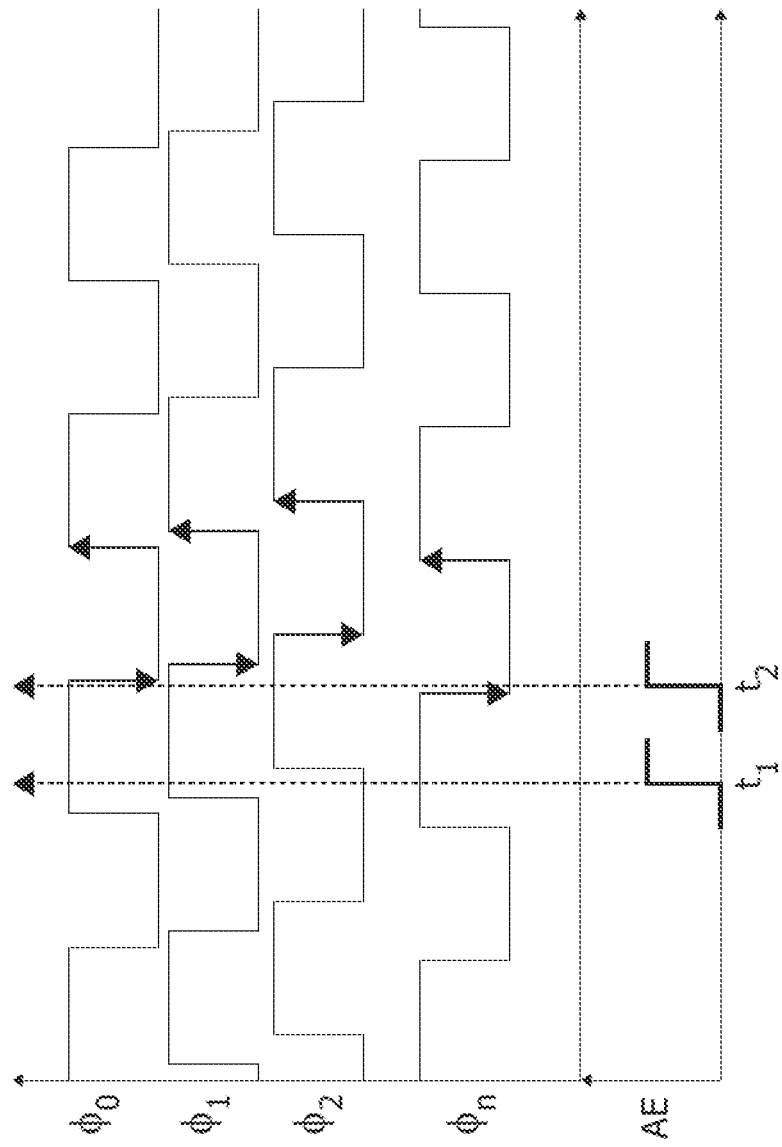

TIME MEASUREMENT CIRCUIT, SYSTEM HAVING A PWM SIGNAL GENERATOR CIRCUIT AND A TIME MEASUREMENT CIRCUIT, AND CORRESPONDING INTEGRATED CIRCUIT

BACKGROUND

Technical Field

The embodiments of the present description refer to time measurement circuits.

Description of the Related Art

Time measurement circuits (chronometers) configured to measure the time elapsed between a first (start) event and a second (stop) event may be useful in a variety of application.

For example, a time measurement circuit may be useful in the context of PWM signals. Generally, as shown in FIG. 1, a PWM signal is a periodic signal having a given switching period $T_{SW}$, wherein the PWM signal is set to high for a given switch-on duration $T_{ON}$ and low for a given switch-off duration $T_{OFF}$, with:

$$T_{SW}=T_{ON}+T_{OFF}. \quad (1)$$

Moreover, often is defined the duty cycle D of the PWM signal, with $D=T_{ON}/T_{SW}$.

Such a PWM signal may be generated in various modes. For example, as shown in FIG. 1, one of the simplest solutions is based on an oscillator circuit generating a clock signal CLK and a counter configured to increase a count value in response to the clock signal CLK. Thus, by using a comparator circuit the PWM signal may be generated as a function of the count value provided by the counter, e.g., by comparing the count value with given threshold values, e.g., indicative of the switch-on duration $T_{ON}$ and the switching period $T_{SW}$.

For example, a time measurement circuit may be useful when the PWM signal is used to drive (e.g., via a half or full bridge) a resonant circuit comprising one or more inductances and/or capacitances, e.g., a LC resonant tank. For example, a typical application may be a wireless power transmitter, or an electronic converter. For example, in this application it may be useful to measure the time elapsed between the rising and/or falling edge of the PWM signal (representing the start event) and a given event (generated in response to the rising or falling edge of the PWM signal). For example, the chronometer may measure the time elapsed between the rising edge of the PWM signal and the instant when a current flowing through a given component of the resonant tank or the voltage at a given component or node of the resonant tank reaches a given threshold value, e.g., the current flowing through or the voltage at one of the components of the LC resonant tank, such as the voltage at a ringing node of the LC resonant tank.

BRIEF SUMMARY

Considering the foregoing, various embodiments of the present disclosure provide solutions for measuring a time elapsed between a start event and a stop event. More specifically, various embodiments relate to solutions for determining a phase value indicative of a time elapsed between an edge of a clock signal and an instant when an asynchronous event signal is set.

According to one or more embodiments, a time measurement circuit is provided having the distinctive elements set forth in the following description. The embodiments also concern a corresponding system comprising a PWM signal generator circuit and a time measurement circuit, and a corresponding integrated circuit.

Various embodiments of the present disclosure relate to a time measurement circuit configured to generate a phase value.

In various embodiments, the time measurement circuit comprises a multiphase clock generator configured to generate a sequence of a given number n of phase shifted clock phases having the same clock period and being phase shifted by a time corresponding to a fraction 1/n of the clock period, wherein one of the phase shifted clock phases represents a reference clock signal.

In various embodiments, the time measurement circuit comprises also a node for receiving an asynchronous event signal, and a phase sampling circuit configured to generate the phase value, the phase value being indicative of the number of the fractions 1/n of the clock period elapsed between an edge of the reference clock signal and the instant when the asynchronous event signal is set.

In various embodiments, the phase sampling circuit comprises various sub-circuits.

Specifically, in various embodiments, a first sub-circuit comprises for each of the phase shifted clock phases a respective first flip-flop, each of the first flip-flops being configured to, in response to the asynchronous event signal, sample the respective phase shifted clock phase, thereby determining a respective first control signal indicating whether the respective clock phase was set to high or low at the instant when the asynchronous event signal was set.

In various embodiments, a second sub-circuit comprises for each of the phase shifted clock phases a respective second flip-flop, each of the second flip-flops being configured to, in response to the respective phase shifted clock phase, sample a respective first control signal, thereby determining a respective second control signal corresponding to a synchronized version of the respective first control signal.

For example, in various embodiments, each of the first flip-flops is configured to sample the respective phase shifted clock phase in response to a rising edged of the asynchronous event signal, and each of the second flip-flops is configured to sample the respective first control signal in response to a falling edge of the respective phase shifted clock phase.

In various embodiments, the time measurement circuit may comprise for each of the phase shifted clock phases a respective logic OR gate, each logic OR gate receiving at input a respective first control signal provided by a respective first flip-flop and a respective second control signal provided by a respective second flip-flop, thereby determining a respective control signal, and wherein each of the second flip-flops is configured to sample one of these control signals, whereby each of the second flip-flops samples a respective first control signal only when the respective first control signal is set to high.

In various embodiments, a third sub-circuit is configured to associate with each of the phase shifted clock phases a further clock phase, the further clock phase corresponding to the phase shifted clock phase of the sequence of phase shifted clock phases preceding the respective clock phase with the time corresponding to the fraction 1/n of the clock period. Moreover, the third sub-circuit determines for each of the phase shifted clock phases a respective third control signal indicating whether:

the second control signal associated with the respective phase shifted clock phase indicates that the respective phase shifted clock phase was set to low at the instant when the asynchronous event signal was set, and the second control signal associated with the respective further clock phase indicates that the respective further clock phase was set to high at the instant when the asynchronous event signal was set.

For example, in various embodiments, the third sub-circuit comprises for each of the phase shifted clock phases a respective logic AND gate, each logic AND gate receiving at input the inverted version of the second control signal associated with the respective phase shifted clock phase, and the second control signal associated with the respective further clock phase, thereby generating the respective third control signal.

In various embodiments, a fourth sub-circuit comprises for each of the phase shifted clock phases a respective third flip-flop, each of the third flip-flops configured to, in response to the respective phase shifted clock phase, sample a respective third control signal, thereby determining a respective fourth control signal corresponding to a synchronized version of the respective third control signal. For example, each of the third flip-flops may be configured to sample the respective third control signal in response to a rising edge of the respective phase shifted clock phase.

Accordingly, as will be described in greater detail in the following, only one of the fourth control signals will be set, i.e., the fourth control signals represent a one-hot encoding of the phase value.

Moreover, in case the reference clock signal is selected amongst the phase shifted clock phases as a function of a selection signal, the phase value may be determined as a function of the fourth control signals and the selection signal.

In general, the time measurement circuit may not only monitor the fractions of the clock cycle, but also the number of clock cycles elapsed since a given event. In this case, the time measurement circuit may comprise a counter circuit configured to increase a count value in response to the reference clock signal, and a counter sampling circuit configured to generate a sampled count value by sampling the count value of the counter circuit.

For example, in various embodiments, the counter sampling circuit comprises:

a first sampling circuit configured to, in response to a rising edge of the reference clock signal, sample the asynchronous event signal, thereby generating a first synchronized asynchronous event signal;

a second sampling circuit configured to, in response to a falling edge of the reference clock signal, sample the asynchronous event signal, thereby generating a second synchronized asynchronous event signal; and a sampling circuit configured to, in response to a rising edge of the reference clock signal, store, as a function of the first and the second synchronized asynchronous event signal, either the count value of the counter circuit or the count value of the counter circuit decreased by one, thereby generating the sampled count value.

As mentioned before, such a time measurement circuit may be useful in a system comprising a PWM signal generator circuit configured to generate a Pulse-Width Modulated signal, e.g., as a function of the count value of the counter circuit, and optionally also the phase shifted clock phases. For example, in this case, the sampled count value and the phase value may be indicative of the number of clock cycles and the fractions 1/n of clock cycles of the reference clock signal elapsed between an edge of the Pulse-Width Modulated signal and the instant when the asynchronous event signal was set.

BRIEF DESCRIPTION OF THE SEVERAL VIEWS OF THE DRAWINGS

The embodiments of the present disclosure will now be described with reference to the drawings, which are provided purely to way of non-limiting example and in which:

FIGS. 9A, 9B, 10A, 10B, 10C, 11A, 11B, 12A, 12B, 12C and 12D show various details of the circuits of FIGS. 6A, 6B and 8;

FIGS. 15, 16 and 17 show details of the count value sampling circuit of FIG. 14; and FIGS. 18, 19 and 20 show an embodiment of a phase value sampling circuit configured to determine a sampled phase value in response to an asynchronous event.

DETAILED DESCRIPTION

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment," "in one embodiment," or the like that may be present in various points of this description do not necessarily refer to one and the same embodiment. Moreover, particular conformations, structures, or characteristics may be combined in any adequate way in one or more embodiments.

The references used herein are only provided for convenience and hence do not define the sphere of protection or the scope of the embodiments.

Figure 1:
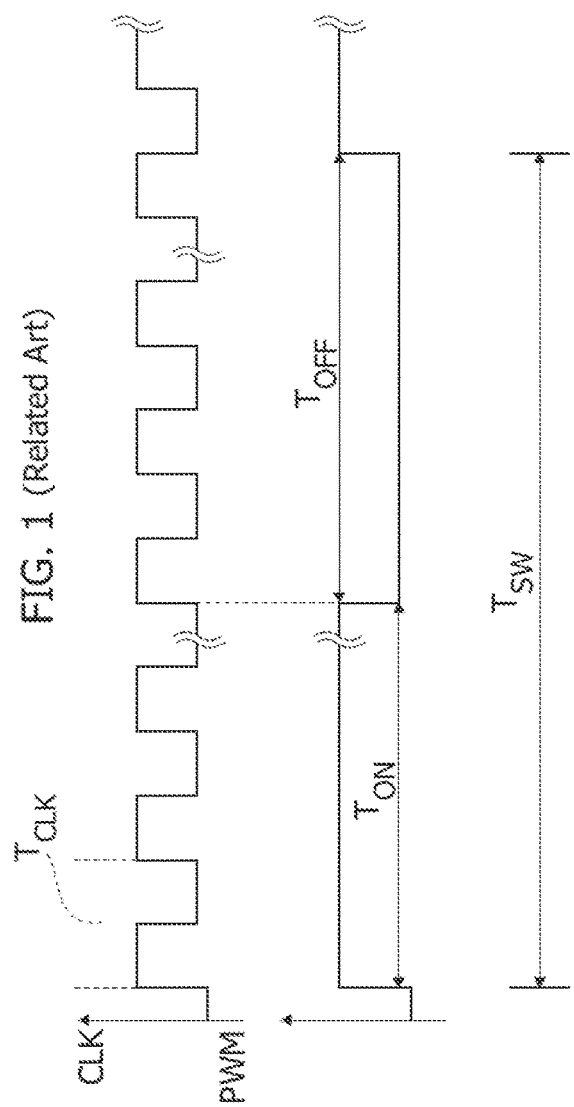
FIG. 1 shows an example of a PWM signal.

In FIG. 2 to 20 described below, parts, elements or components that have already been described with reference to FIG. 1 are designated by the same references used previously in these figures. The description of these elements has already been made and will not be repeated in what follows in order not to burden the present detailed description.

As explained in the foregoing, time measurement circuits (chronometers) configured to measure the time elapsed between a first (start) event and a second (stop) event may be useful in a variety of application, such as for measuring the time elapsed between the rising and/or falling edge of a PWM signal (representing a start event) and a given event generated in response to the rising or falling edge of the PWM signal. Generally, the second/stop event may thus be signaled via an asynchronous external signal.

Thus, before discussing embodiments of time measurement circuits, first possible solutions for generating PWM signals will be discussed.

As described with respect to FIG. 1, one of the simplest solutions for generating a PWM signal is based on an oscillator circuit generating a clock signal CLK and a counter configured to increase a count value in response to the clock signal CLK. Thus, by using a comparator circuit the PWM signal may be generated as a function of the count value provided by the counter, e.g., by comparing the count value with given threshold values, e.g., indicative of the switch-on duration $T_{ON}$ and the switching period $T_{SW}$.

However, in such a (digital) implementation, the accuracy and resolution of the PWM signal is limited by the clock period $T_{CLK}$ (sampling frequency) of the clock signal CLK. Moreover, by increasing the clock frequency $F_{CLK}=1/T_{CLK}$ also the switching losses will increase.

However, in many applications, high resolution PWM signals are required or strongly preferred. For example, as mentioned before, PWM signals may be used in many applications to control the average value of a voltage or current, such as for wireless battery chargers, switching mode power converters, motor control and lighting. For example, in such applications a half-bridge or full bridge may be used to drive a resonant tank, usually comprising one or more inductors and capacitors, wherein the electronic switches of the half-bridge or full bridge are driven by means of PWM signals.

In order to miniaturize the equipment, small inductors may be used leading to a high working frequency. Thus, often a high-frequency modulated waveform PWM signal with high precise resolution should be provided in order to keep power consumption at acceptable values. For example, in a switching power supply, the output voltage is often directly proportional to the PWM duty cycle. The smaller is the adjustment to the duty cycle, the smaller is the resulting change to the output, i.e., a more precise control of the output voltage permits to achieve a better accuracy level and system stability. Moreover, minimizing output voltage ripple means reduce noise levels.

An alternative solution for generating a PWM signal, in particular a High Resolution (HR) PWM signal, is based on the use of multiple clock phases, i.e., phase-shifted clock signals having the same frequency.

Figure 2:
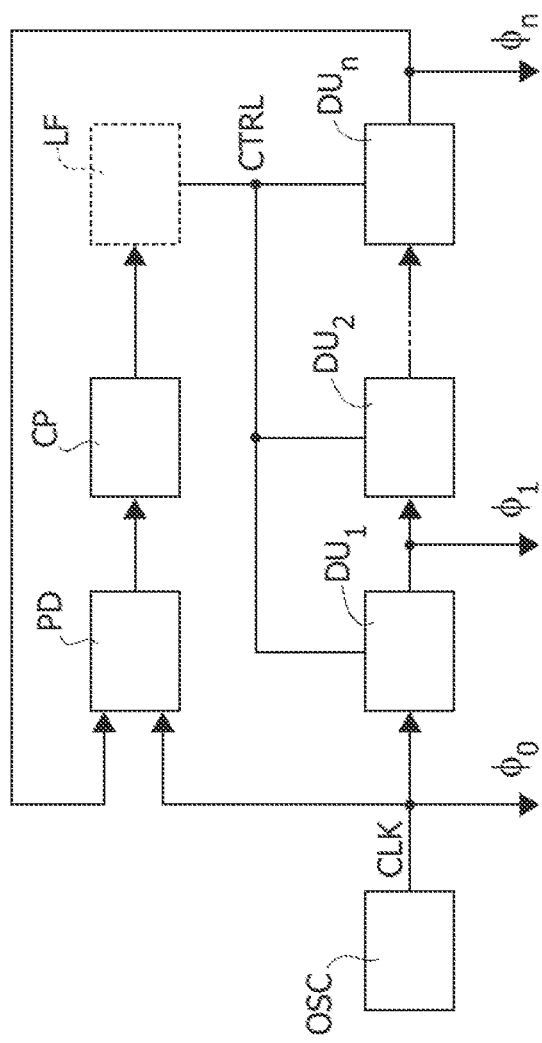
FIG. 2 shows an example of a circuit generating multi-phase clock signals.

For example, FIG. 2 shows a possible circuit for generating multiple clock phases $\phi_0..\phi_n$, via a Delay Locked Loop (DLL).

Specifically, in the example considered the clock signal CLK generated by an oscillator OSC is fed to a cascade of a plurality of (identical) delay stages $DU_1..DU_n$. Specifically, in the example considered, the first phase $\phi_0$ corresponds to the clock signal CLK, and the other phases $\phi_1..\phi_n$ correspond to the output signals of the delay stages $DU_1..DU_n$.

In the example considered, each of the delay stages $DU_1..DU_n$ has a delay $T_{DU}$ being programmable/settable as a function of a (voltage or current) control signal CTRL. For example, such delay stages DU having a variable delay may be implemented with an even number of inverters, wherein one or more of the inverters charges a respective capacitance, such as a parasitic capacitance, connected to the output of the inverter. In this case, the control signal CTRL may be indicative of the current provided by the inverter to charge the respective capacitance, thereby varying the time until the following inverter switches.

In the example considered, the last phase $\phi_n$ (having a given delay $T_D=n\cdot T_{DU}$ with respect to the clock signal CLK) and the clock signal CLK is provided to a phase detector PD. The output of the phase detector PD is fed to a regulator CP having at least an I (Integral) component, such as a charge pump, wherein the regulator CP provides at output the control signal CTRL. Optionally the control signal CTRL may be passed through a loop filter LF.

Thus, essentially, the negative feedback loop, implemented by the blocks PD/CP/LF, synchronizes in time the last phase $\phi_n$ with the clock signal CLK. If the delay cells DU are identical, all the clock phases $\phi_1..\phi_n$ will have the same frequency $f_{CLK}$, but are phase shifted with respect to the preceding phase by a delay of $T_{DU}=T_{CLK}/n$.

Such multiple clock phases may also be provided by a Phase Locked Loop (PLL) comprising a Voltage Controlled Oscillator (VCO) comprising a ring-oscillator with a plurality of delay stages, wherein the PLL is locked to the frequency of a clock signal CLK. Also in this case, a locking of the PLL may be obtained by varying the delay introduced by the delay stages, e.g., by varying via a bias circuit the current provided by the inverter stages implementing such delay stages, until the oscillator signal at the output of the VCO corresponds to the clock signal CLK. Thus, each delay stage of the VCO may provide a respective clock phase, which is phase shifted by a given fraction of the period of the clock signal CLK.

Figure 3:
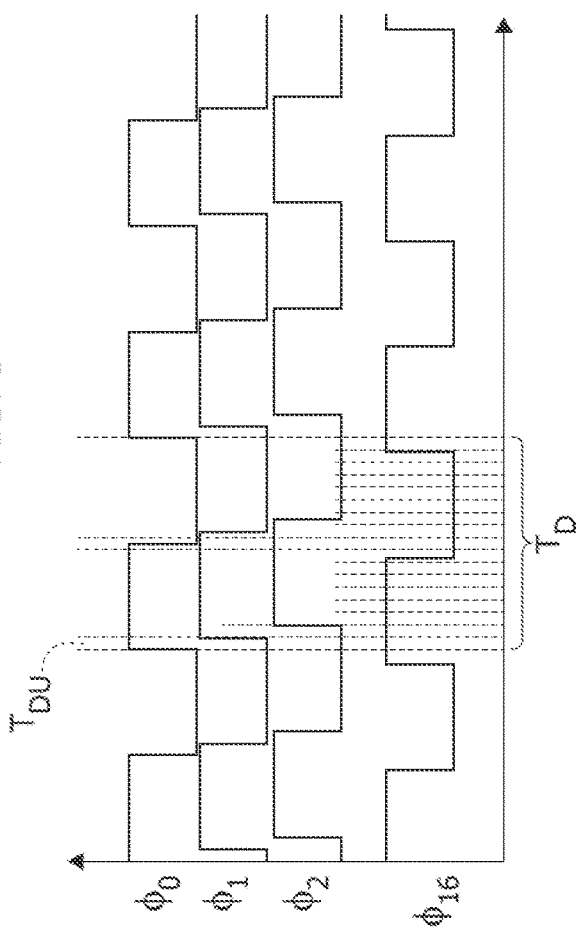
FIG. 3 shows an example of the waveforms of clock phases provided by the circuit of FIG. 2.

For example, FIG. 3 shows exemplary waveforms for the phases $\phi_1..\phi_{16}$ in case n=17, wherein the last phase $\phi_{17}=\phi_0=$CLK is not shown in the Figure.

Figure 4:
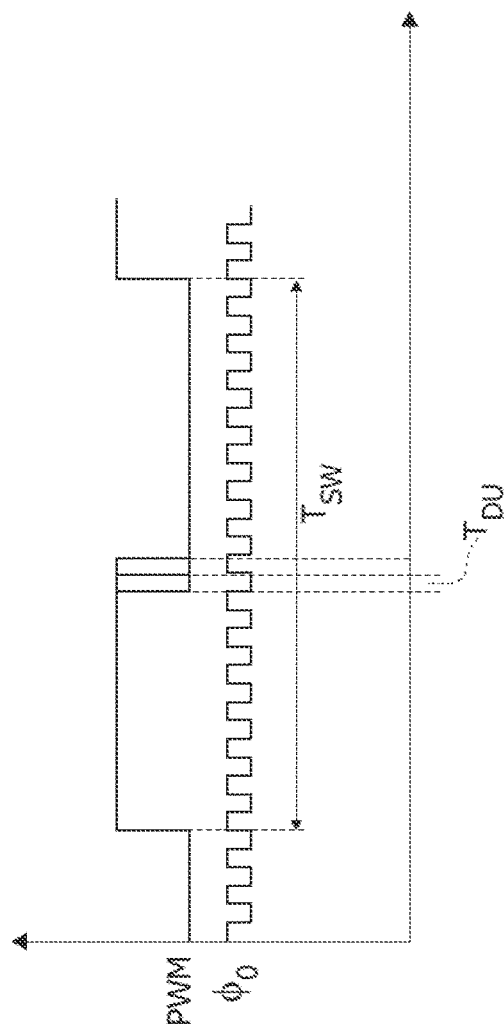
FIG. 4 shows an example of the fine tuning of the switch-on duration of a PWM signal by means of multi-phase clock signals.

Accordingly, as shown in FIG. 4, while a counter and respective comparator circuit may provide a coarse PWM signal (having a plurality k of clock cycles of the clock signal CLK), the additional clock phases $\phi_1..\phi_n$ may be used to add a fine tuning to the coarse PWM signal, which essentially permits to add fractions $T_{DU}$ of the clock signal CLK to the coarse PWM signal. For example, such a solution is described in document U.S. Pat. No. 7,206,343 B2, the content thereof being incorporated herein by reference for this purpose.

For example, the fraction may be added to the coarse PWM signal by:
- directly combining, e.g., by using one or more logic (e.g., OR) gates, the coarse PWM signal with a given selected clock phase $\phi$, or
- as described in document U.S. Pat. No. 7,206,343 B2, indirectly by passing the coarse PWM signal through additional delay stages and combining the coarse PWM signal with the delayed PWM signal, e.g., via a logic (e.g., OR) gate, wherein the additional delay stages introduce the same delay $T_{DU}$ as the delay stages $DU_1..DU_n$, e.g., by biasing the additional delay stages with the same control signal CTRL as the delay stages $DU_1..DU_n$.

Thus, assuming that the counter (and a respective comparator circuit) provides a coarse PWM signal having a switching period $T_{SW}=i\cdot T_{CLK}$ and a switch-on duration of $T_{ON}=k\cdot T_{CLK}$, with $0\leq k\leq i$, the final PWM signal may have a switching period $T_{SW}=i\cdot T_{CLK}$ and a switch-on duration $T_{ON}=k\cdot T_{CLK}+l\cdot T_{CLK}/n$, with $0\leq l<n$. Thus, the switch-on duration $T_{ON}$ of the PWM signal may be selected by setting the integer values of the parameters k and l. Thus, essentially the use of an additional DLL or PLL permits to vary the switch-on duration $T_{ON}$, or in general the duty cycle D, with a higher precision, while the switching period $T_{SW}$ remains constant.

However, in various embodiments, the PWM signal generator circuit may also be configured to receive a plurality of clock phases $\phi_0..\phi_n$ and generate both the rising and the falling edges of the PWM signal as a function of these clock phases $\phi_0..\phi_n$, thereby controlling both the PWM duty cycle and the PWM frequency with a higher resolution.

Figure 5:
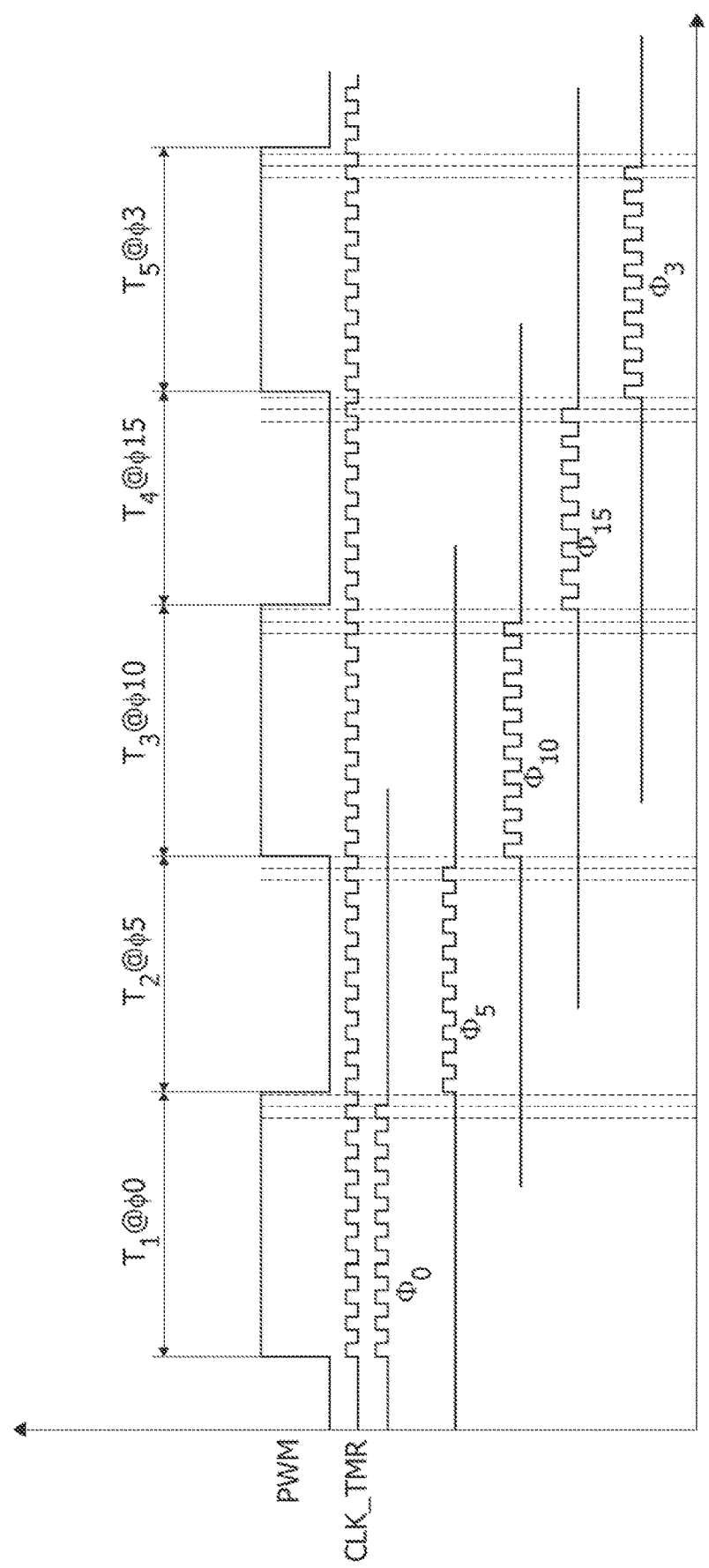
FIG. 5 shows an embodiment of the fine tuning of both the switch-on duration and the switch-off duration of a PWM signal by means of multi-phase clock signals.

FIG. 5 shows the general operation of a first embodiment.

In the embodiment considered, the PWM signal generator circuit receives the first clock phases $\phi_0$ (and/or the last clock phase $\phi_n=\phi_0$) and the intermediate clock phases $\phi_1..\phi_{n-1}$. In some embodiments, the PWM signal generator circuit includes a multiphase clock generator that generates the various clock phases, which may include any multiphase clock generator configured to generate the clock phases described herein. Possible solutions for generating such clock phases are already described in the introduction of the present disclosure, and the relevant description applies in its entirety (see in particular the description of FIG. 2). That is, in some embodiments, the multiphase clock generator circuit of various embodiments of the present disclosure may be as described, for example, with respect to FIG. 2.

Moreover, in the embodiment considered, the PWM signal generator circuit is configured to generate a PWM signal, wherein:
 the switching duration $T_{SW}$ may be set to $T_{SW}=i\cdot T_{CLK}+j\cdot T_{CLK}/n$; and
 the switch-on time $T_{ON}$ may be set to $T_{ON}=k\cdot T_{CLK}+l\cdot T_{CLK}/U$.

In various embodiments, the parameters i, j, k and l integer values, wherein the parameters i, j, k and l may be programmable.

Specifically, in the example shown in FIG. 5, it is assumed that n=17, e.g., the PWM signal generator circuit receives the clock phases $\phi_0..\phi_{16}$, and the PWM signal generator circuit is configured to generate a PWM signal with:

$T_{SW}=i\cdot T_{CLK}+10\cdot T_{CLK}/17=T_i+10\cdot T_{CLK}/17$, a duty cycle of 50% (i.e., $T_{ON}=T_{OFF}=T_{SW}/2$), i.e., $T_{ON}=T_{OFF}=T_i/2+5\cdot T_{CLK}/17$.

In the example considered, it will be assumed for simplicity that i is an even number, and k=p=i/2.

Specifically, in the embodiment considered, the PWM signal generator circuit is configured to use during the first switch-on period $T_1$ the phase $\phi_0$ as clock signal for the digital counter counting the time period $T_i/2=k\cdot T_{CLK}$, and (as will be described in greater detail in the following) the PWM signal generator circuit adds at the end a fraction of 5/17 of the period $T_{CLK}$ by using the phase $\phi_5$.

However, instead of then tracking the accumulation of the various fractions, the PWM signal generator circuit uses then during the following switch-off period $T_2$ the phase $\phi_5$ (i.e., the phase used to add the fraction) as clock signal for the timer circuit (i.e., the digital counter counting the time period $p\cdot T_{CLK}$) Moreover, the PWM signal generator circuit adds at the end again the respective fraction of 5/17 of the period $T_{CLK}$ by using in this case the phase $\phi_{10}$, insofar as the phase $\phi_{10}$ is shifted by a delay of $5\cdot T_{CLK}/17$ with respect to the phase $\phi_5$.

Next, the PWM signal generator circuit use during the second switch-on period $T_3$ the phase $\phi_{10}$ as clock signal for the digital counter counting the time period $k\cdot T_{CLK}$, and the PWM signal generator circuit adds at the end a fraction of 5/17 of the period $T_{CLK}$ by using this time the phase $\phi_{15}$, insofar as the phase $\phi_{15}$ is shifted by a delay of $5\cdot T_{CLK}/17$ with respect to the phase $\phi^{10}$.

Similarly, the PWM signal generator circuit use during the following switch-off period $T_4$ the phase $\phi_{15}$ as clock signal for the digital counter counting the time period $p\cdot T_{CLK}$, and the PWM signal generator circuit adds at the end a fraction of 5/17 of the period $T_{CLK}$ by using this time the phase $\phi_3$, insofar as the phase $\phi_3$ is shifted by a delay of $5\cdot T_{CLK}/17$ with respect to the phase $\phi_{15}$.

This operation continues also for the following switch-on and switch off periods.

In various embodiments, the PWM generator circuit is thus configured to generate a PWM signal, wherein:
 the switch-on duration corresponds to $T_{ON}=k\cdot T_{CLK}+l\cdot T_{CLK}/n$; and
 the switch-off duration corresponds to $T_{OFF}=p\cdot T_{CLK}+q\cdot T_{CLK}/n$.

In various embodiments, the parameter n (number of delay stages/phase) is fixed at a hardware level. However, the number n could also be programmable, e.g., by using in FIG. 2 a given fixed number of delay stages (e.g., 32) and selecting the n-th phase (and not necessarily the last one) as feedback signal provided to the phase detector PD. In fact, in this way, the control loop will still be locked to the n-th phase $\phi_n$, with $T_{DU}=T_{CLK}/n$.

Thus, in various embodiments, the timer circuit of the PWM signal generator circuit (comprising the counter circuit and the comparator circuit) is configured to:
 during a switch-on period $T_{ON}$, increase a count value from a reset value until the count value reaches the integer value k; and
 during a switch-off period $T_{OFF}$, increase a count value from a reset value until the count value reaches the integer value p.

However, in general, the timer circuit may also monitor the switching duration $T_{SW}$, i.e., the timer circuit of the PWM signal generator circuit (comprising the counter circuit and the comparator circuit) may be configured to:
 during a switch-on period, increase a count value from a reset value until the count value reaches the integer value k; and
 during a switch-off period, increase the count value used during the switch-on period until the count value reaches the integer value i.

Thus, in various embodiments, the PWM signal generator circuit is configured to determine the parameters k/l, and at least one of p/q, and i/j wherein:
 in case of a switch-on period $T_{ON}$, k corresponds to the integer number of clock cycles of the clock signal CLK and l corresponds to the integer number of the fractions 1/n of a clock cycle of the clock signal CLK;
 in case of a switch-off period $T_{OFF}$, p corresponds to the integer number of clock cycles of the clock signal CLK and q corresponds to the integer number of the fractions 1/n of a clock cycle of the clock signal CLK; and in case of a switching period $T_{SW}$, i corresponds to the integer number of clock cycles of the clock signal CLK and j corresponds to the integer number of the fractions 1/n of a clock cycle of the clock signal CLK.

Specifically, in view of the above definitions:

$$T_{ON} = k \cdot T_{CLK} + l \cdot T_{CLK}/n \quad (2)$$

$$T_{OFF} = p \cdot T_{CLK} + q \cdot T_{CLK}/n \quad (3)$$

$$T_{SW} = T_{ON} + T_{OFF} = i \cdot T_{CLK} + j \cdot T_{CLK}/n \quad (4)$$

the integer values i and j are related to the integer values k, l, p and q according to the following equations:

in case (l+q)<n (without overflow):

$$i = k+p; j = l+q; \quad (5)$$

in case (l+q)≥n (with overflow):

$$i = k+p+1; j = l+q-n. \quad (6)$$

Thus, in various embodiments, the PWM generator circuit is configured to receive at least two of the parameters i, k and p, and at least two of the parameters j, l and q. For example, the PWM signal generator circuit may directly receive the parameters k/l and/or p/q and/or i/j, such as:

data identifying (e.g., corresponding to) the parameters k/l; and data identifying (e.g., corresponding to) the parameters p/q.

Figure 6A:
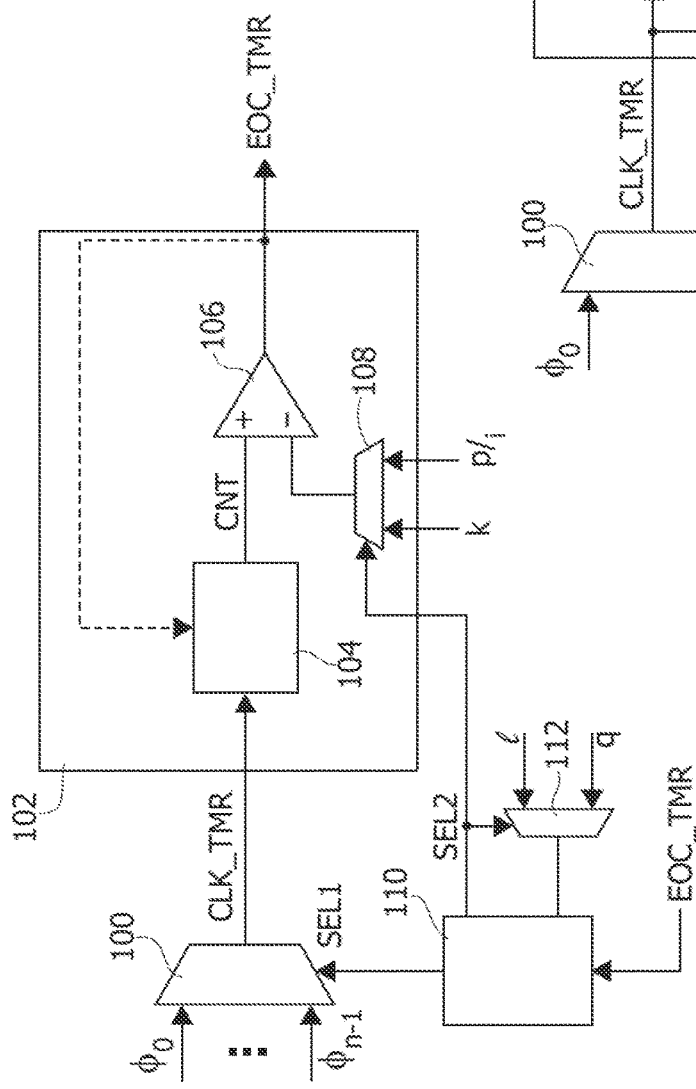
FIGS. 6A and 6B show embodiments of a timer circuit in accordance with the present disclosure.

Alternatively, the PWM signal generator circuit may receive other data permitting a calculation of these parameters according to equations (5) and (6), such as:

data identifying the switching duration $T_{SW}$, such as the above-mentioned parameters i and j, and one of:

data identifying (e.g., corresponding to) the parameters k/l;

data identifying (e.g., corresponding to) the parameters p/q; or data identifying the duty cycle As shown in FIG. 6A, in various embodiments, the PWM signal generator circuit comprises a timer circuit 102 comprising a digital counter circuit 104 configured to vary (i.e., increase or decrease) an integer count value CNT in response to a clock signal CLK_TMR and a comparator circuit 106 configured to compare the count value CNT with a respective integer comparison threshold.

As shown in FIG. 6A, the same counter 104 and comparator 106 may be used for both the switch-on period and the switch-off period by selecting, e.g., via a multiplexer 108, the parameter k or p as comparison threshold. Accordingly, by resetting the counter 104 via the signal at the output of the comparator 106, the same counter 104 may be used to monitor the switch-on period and the switch-off period. However, the counter 104 may also be used to monitor the switch-on period and the duration $T_{SW}$. For example, in this case, the multiplexer 108 may receive the parameters k and i, and the counter 104 may only be reset when the count value CNT reaches the value i.

Figure 6B:
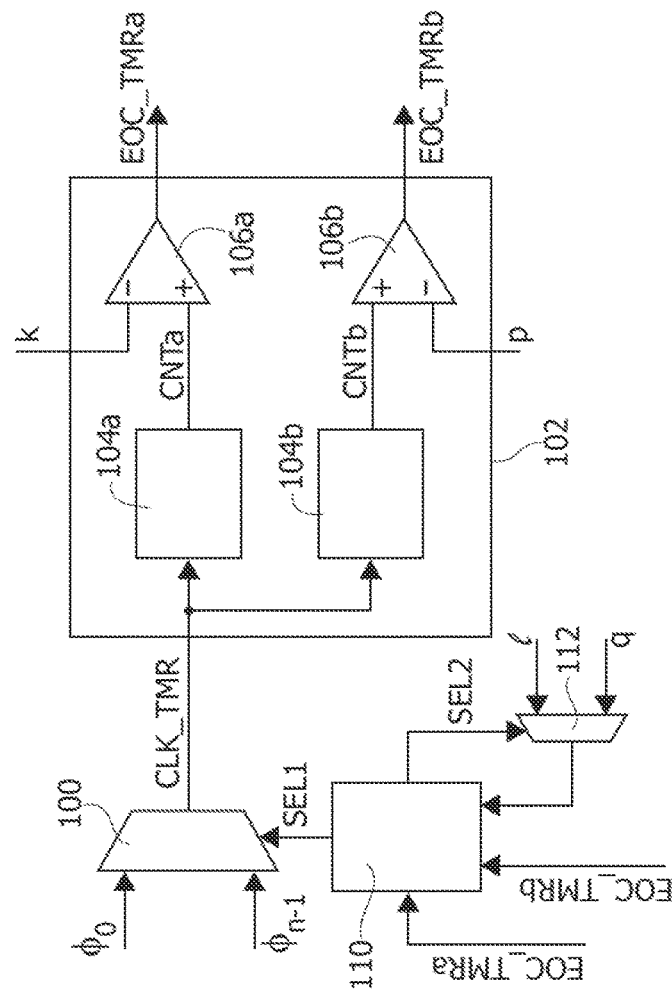

Alternatively, as shown in FIG. 6B, a respective counter 104a and 104b and comparator 106a and 106b may be used for the switch-on period and the switch-off period, wherein the comparator 106a compares a count value CNTa provided by the counter 104a with the parameter k and the comparator 106b compares a count value CNTb provided by the counter 104b with the parameter p.

In various embodiments, the timer circuit 102 is configured to generate one or more trigger signal when the output of the comparator indicates that the count value has reached the comparison threshold, e.g., by using a signal EOC_TMR at the output of the comparator 106, or respective signal EOC_TMRa and EOC_TMRb at the outputs of the comparators 106a and 106b.

In the embodiments considered, the signal EOC_TMR (FIG. 6A) or the signals EOC_TMRa and EOC_TMRb (FIG. 6B) are provided to a control circuit 110 with selects the clock signal CLK_TMR for timer circuit 102, in particular the counter 104 (104a/104b), as a function of:

during a switch-on period, the parameter l; and during a switch-off period, the parameter q.

Specifically, even when monitoring the end of the switching duration $T_{SW}$, it is preferably to obtain, e.g., calculate according to equations (5) and (6), the parameter q, because this parameter indicates the additional fractions which have to be added with respect to the previous switch-on period.

For example, the control circuit 110 may select the clock signal CLK_TMR by driving via a selection signal SEL1 a multiplexer 100 receiving at input the clock phases $\phi_0..\phi_{n-1}$. Similarly, the control signal may drive via a selection signal SEL2 a multiplexer 112 in order to select either the parameter l or the parameter q, i.e., the selection signal indicates whether the current period is a switch-on period or a switch-off period, and may thus also be used to drive the multiplexer 108.

Specifically, in various embodiments, in response to a trigger in the signal EOC_TMR (FIG. 6A) or the signals EOC_TMRa and EOC_TMRb (FIG. 6B), the control circuit 110 is configured to change the logic value of the selection signal SEL1:

during a switch-on period, as a function of the parameter l; and during a switch-off period, as a function of the parameter q.

Specifically, in various embodiments, the control circuit also performs a modulo operation in order to maintain the selection signal SEL1 between 0 and n−1. Accordingly, in response to a trigger in the signal EOC_TMR (FIG. 6A) or the signals EOC_TMRa and EOC_TMRb (FIG. 6B), the control circuit 110 varies the selection signal SEL1:

during a switch-on period, SEL1=(SEL1+l) mod n; and during a switch-off period, SEL1=(SEL1+q) mod n.

Thus, essentially, the control circuit 110 implements a phase accumulator circuit, which adds to the currently selected phase either l or q, wherein the parameters q may be calculated, e.g., as shown in equations (5) and (6) as a function of the parameters j and n.

Finally, in various embodiments, the respective period (either a switch-on or switch-off period) is terminated and the following period is started with the next clock pulse (i.e., with the next rising or falling edge based on which type of edge is used by the timer circuit 102) of the selected clock phase.

Thus essentially, during a switch-on period $T_{ON}$ the trigger signal EOC_TMR (or EOC_TMRa) is generated after a time $k \cdot T_{CLK}$, and by changing the clock signal CLK_TMR the switch-on period is terminated, thereby starting the following switch-off period, after an additional time $l/n \cdot T_{CLK}$. Similarly, during a switch-off period $T_{OFF}$ the trigger signal EOC_TMR (or EOC_TMRb) is generated after a time $p \cdot T_{CLK}$ (which may be obtained, e.g., by resetting the counter 104 and waiting for p cycles or by waiting until the count value reaches i), and by changing the clock signal CLK_TMR the switch-off period is terminated, thereby starting the following switch-on period, after an additional time $q/n \cdot T_{CLK}$.

Figure 7:
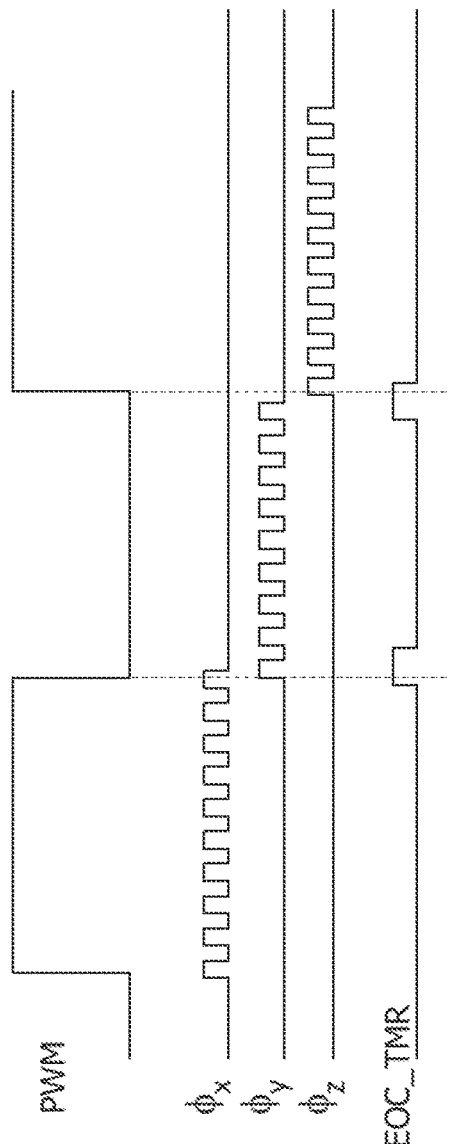
FIG. 7 shows exemplary waveforms generated by the timer circuits of FIGS. 6A and 6B.

For example, this is shown in FIG. 7, wherein during a switch-on period, the timer circuit uses a clock phase CLK_TMR=$\phi_x$, and the trigger signal EOC_TMR is set after, e.g., k=9 periods of the phase $\phi_x$, e.g., with the $10^{th}$ rising edge. In response to the trigger signal EOC_TMR (EOC_TMRa) the control circuit selects a new phase CLK_TMR=$\phi_y$ (with y=(x+l) mod n). Moreover, in response to the immediately following (e.g., rising) edge in the signal $\phi_y$, the PWM signal generator circuit terminates the switch-on period and starts the following switch-off period, thereby introducing an additional time corresponding a fraction l/n of the clock period.

In the embodiment considered, during the following switch-off period, the timer circuit uses then the clock phase CLK_TMR=$\phi_y$, and the trigger signal EOC_TMR is set after, e.g., p=8 periods of the phase $\phi_y$, e.g., with the $9^{th}$ rising edge. In response to the trigger signal EOC_TMR (EOC_TMRb) the control circuit selects a new phase CLK_TMR=$\phi_z$ (with z=(y+q) mod n). In response to the immediately following (e.g., rising) edge in the signal $\phi_z$, the PWM signal generator circuit terminates the switch-off period and starts the following switch-on period, thereby introducing an additional time corresponding a fraction q/n of the clock period.

In the previous embodiments, the control circuit 110 is configured to drive the selection circuit 100 in order to changes the phase $\phi$ assigned to the clock signal CLK_TMR from the current phase (t) (e.g., $\phi_0$) to the next phase $\phi(t+1)$ (e.g., $\phi_5$) in response to the signal EOC_TMR, thereby adding the fractions (l or q) at the end of the respective switch-on or switch-off period.

However, in various embodiments, the switching from the current phase $\phi(t)$ to the next phase $\phi(t+1)$ may occur at any instant during the respective period. In this case, the control unit 110 may also be configured to either increase/decrease sequentially, e.g., in response to the clock signal CLK_TMR, the selection signal SEL1 from the old phase $\phi(t)$ to the new phase $\phi(t+1)$ (e.g., $\phi_0$, $\phi_1$, $\phi_2$, $\phi_3$, $\phi_4$, $\phi_5$) or by switching directly to the new phase $\phi(t+1)$.

Generally, while reference has been made to periods of the clock signal CLK, indeed the phases $\phi_0 \ldots \phi_{n-1}$ may also have a different clock period $T_{PLL}$, e.g., the frequency $f_{PLL}=1/T_{PLL}$ may be a multiple of the clock frequency $f_{CLK}$, e.g., by using a frequency divider in the feedback loop of the phase $\phi_{n-1}$. Accordingly, in general:

the switch-on duration corresponds to $T_{ON}=k \cdot T_{PLL}+l \cdot T_{PLL}/n$; and
the switch-off duration corresponds to $T_{OFF}=p \cdot T_{PLL}+q \cdot T_{PLL}/n$.

Figure 8:
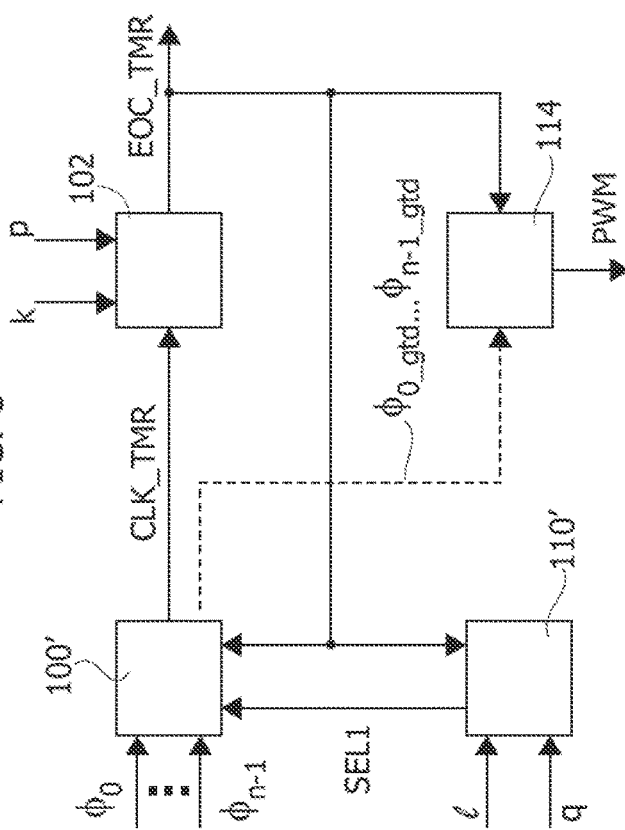
FIG. 8 shows an embodiment of a PWM generator circuit.

FIG. 8 shows a second embodiment of a PWM signal generator circuit.

Specifically, in the embodiment considered, the PWM signal generator circuit comprises again a timer circuit 102, a clock switching circuit 100' and a control circuit/phase accumulator 110'.

Specifically, with respect to FIGS. 6A and 6B, the clock switching circuit 100' is not implemented with a mere multiplexer, but with a circuit which directly generates, in response to the trigger signal EOC_TMR provided by the timer circuit 102, the clock signal CLK_TMR for the timer circuit as a function of the selection signal SEL1 provided by the control circuit 110'. Generally, as described in the foregoing, also any other trigger signal may be used to assign to the clock signal CLK_TMR a new clock phase as a function of the selection signal SEL1.

Figure 9A:
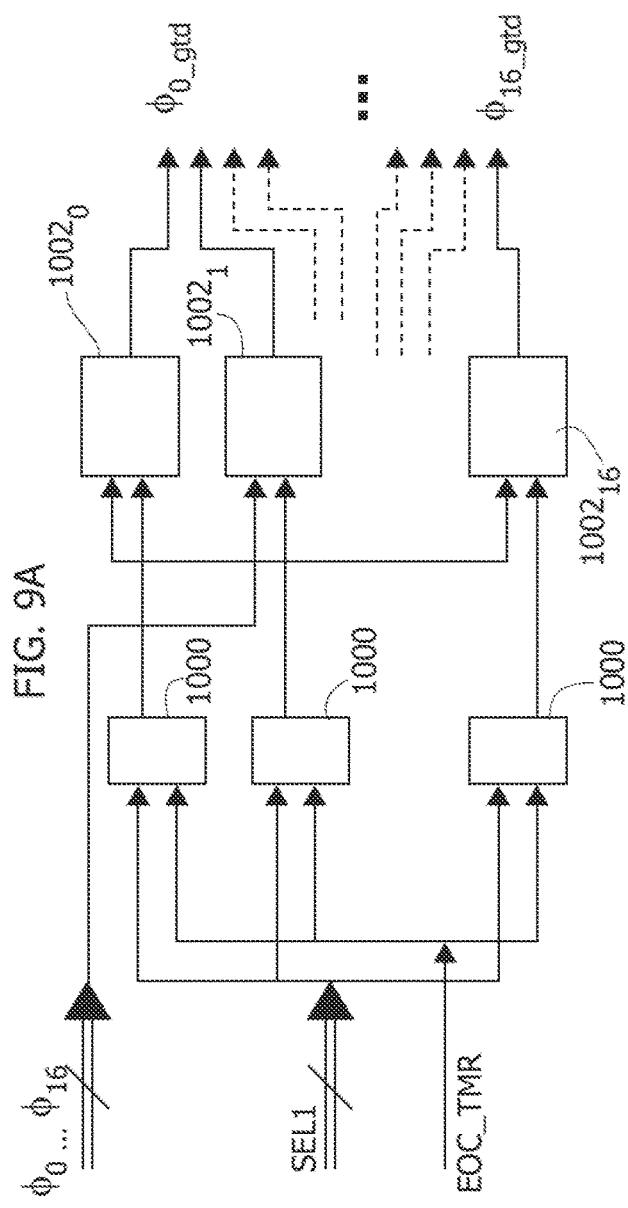
Figure 9B:
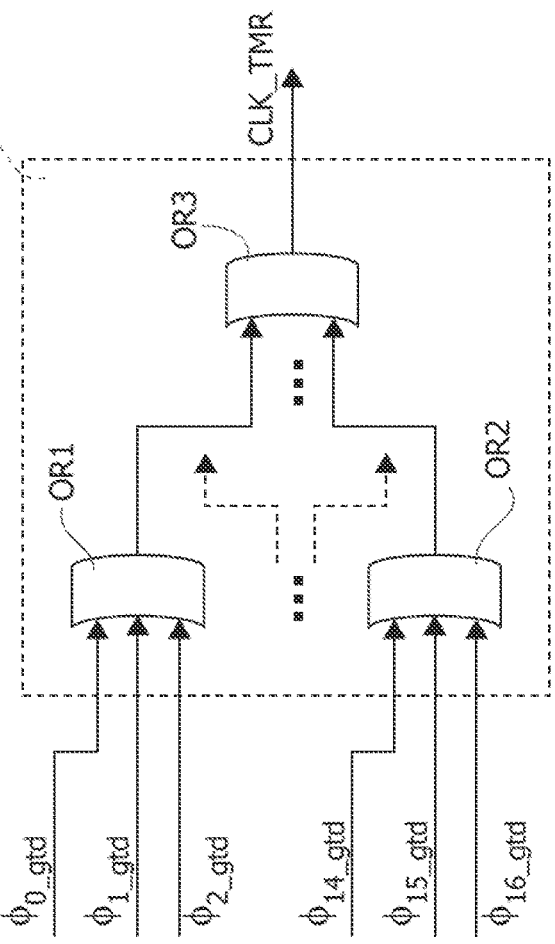

For example, a possible embodiment of the clock switching circuit 100' is shown in FIGS. 9A and 9B.

In the embodiment considered, the selection signal SEL1 (indicative of the next clock phase), is provided to a series of optional latches 1000 configured to store the value of the signal SEL1 in response to the trigger signal EOC_TMR. Substantially, these latches 1000 ensure that the circuit samples the value of the signal SEL1 only when a trigger in the signal EOC_TMR is generated.

In the embodiment considered, each clock phase $\phi_0 \ldots \phi_{n-1}$ is provided to a respective transmission gate (gated clock cells) $1002_0 \ldots 1002_n$ being enabled as a function of the selections signal SEL1 or optionally the latched selections signal SEL1, thereby generating respective (gated) signals $\phi_{0\_gtd} \ldots \phi_{n-1\_gtd}$. For example, in various embodiments, the selection signal comprises (n) bits $SEL_0 \ldots SEL_{n-1}$ and uses a one-hot encoding, wherein a given bit is associated univocally with a given clock phase $\phi_0 \ldots \phi_{n-1}$, i.e., only one of the bits $SEL_0 \ldots SEL_{n-1}$ is set and indicates that the respective clock phase $\phi_0 \ldots \phi_{n-1}$ may pass through the respective transmission gate $1002_0 \ldots 1002_{n-1}$, while the other clock phases $\phi_0 \ldots \phi_{n-1}$ cannot pass through the respective transmission gates $1002_0 \ldots 1002_{n-1}$. In general, also other encoding schemes may be used for the selection signal (such as a binary encoding), and the transmission gates may be driven via a decoder circuit configured to generate the one-hot encoded drive signals for the transmission gates $1002_0 \ldots 1002_{n-1}$ as a function of the selection signal SEL1.

As shown in FIG. 9B, the signals $\phi_{0\_gtd} \ldots \phi_{n-1\_gtd}$ are then provided to a combinational logic circuit 1004 configured to generate at output the clock signal CLK_TMR for the timer circuit 102 by combining the signals $\phi_{0\_gtd} \ldots \phi_{n-1\_gtd}$. For example, in various embodiments the signals $\phi_{0\_gtd} \ldots \phi_{n-1\_gtd}$ are combined via a logic OR operation, e.g., implemented with a cascaded structure of a plurality of OR gates OR1, OR2, OR3, etc.

FIG. 10A shows the operation of the clock switching circuit 100' at the example of a selection signal SEL1 having in sequence the value k, x and y, thereby activating (in response to the trigger signal EOC_TMR) in sequence the clock phases $\phi_{k\_gtd}$, $\phi_{x\_gtd}$ and $\phi_{y\_gtd}$.

Thus, in case the selection signal SEL1 changes, the clock signal CLK_TMR switches from a first clock phase to a second clock phase in response to the selection signal.

Specifically, as shown in FIG. 10B, when the second clock phase ($\phi_{x\_gtd}$) goes to high (rising edge), while the first clock phase ($\phi_{k\_gtd}$) is still high, the resulting clock signal CLK_TMR will have a single clock pulse with a duration being greater than the clock period $T_{PLL}$ of the clock phases $\phi_0 \ldots \phi_{n-1}$, thereby essentially losing a clock cycle.

Usually this occurs when the respective fraction l or q is smaller than n/2.

Conversely, as shown in FIG. 10C, when the second clock phase ($\phi_{y\_gtd}$) goes to high (rising edge), while the first clock phase ($\phi_{x\_gtd}$) is low, the resulting clock signal CLK_TMR will have a single clock pulse, with a duration being smaller than the clock period $T_{PLL}$ of the clock phases $\phi_0 \ldots \phi_{n-1}$. Usually this occurs when the respective fraction l or q is greater than n/2.

Thus, the lost clock edge (FIG. 10B) should be taken into account in order to correctly determine the duration of the respective time interval. Specifically, in various embodiments, in case a clock cycle is lost, i.e., the respective fraction l or q is smaller than n/2, the PWM signal generator circuit is configured to increase the timer circuit 102 by an additional clock cycle, i.e., the timer 102 is increase by 2 and not only 1 for a single clock cycle.

Figure 11A:
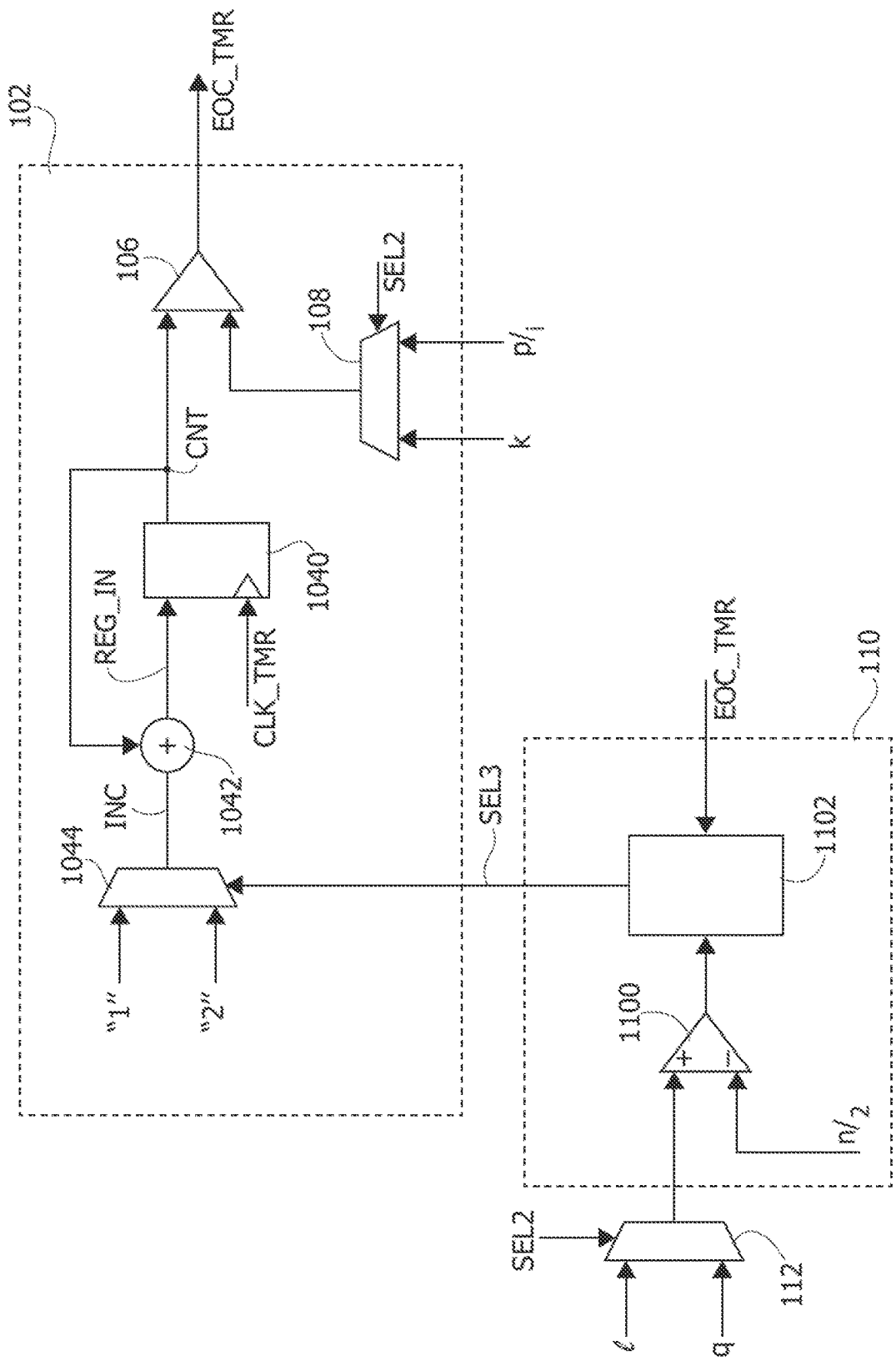

FIG. 11A shows a possible embodiment of the timer circuit 102.

Specifically, in the embodiment considered, the counter 104 is implemented with an accumulator comprising:

- a register 1040 providing at an output the count value CNT, wherein the register 1040 is configured to store a signal REG_IN at a respective input in response to the clock signal CLK_TMR; and
- a digital adder 1042, configured to generate the signal REG_IN at the input of the register 1040 by adding an increment value INC to the count value CNT.

In the embodiment considered, the increment value INC may be set either to "1" or "2," e.g., via a multiplexer 1044. Specifically, the selection is driven via a selection signal SEL3 provided by the control circuit 110 (or similarly by the control circuit 110').

Specifically, in the embodiment considered, the control circuit 110 comprises:

- a digital comparator 1100 configured to determine whether the fraction value l or q of the current switch-on or switch-off period is greater than n/2; and
- a circuit 1102 configured to generate a selection signal SEL3 as a function of the comparison signal generated by the comparator 1100 and a trigger signal indicating the start of a new switch-on or switch-off period, such as the signal EOC_TMR or, in the general case, as a function of the comparison signal generated by the comparator 1100 and a generic trigger signal whose length is one CLK_TMR cycle and generated in any appropriate instant during the switch-on or switch-off period.

Specifically, in the embodiment considered, the multiplexer 112 already provide the fraction value for the current period, wherein the selection signal SEL2 indicates whether the current period is a switch-on or switch-off period. Accordingly, the comparator 1100 may receive at input the signal provided by the multiplexer 112 and thus generates a comparison signal indicating whether the fraction value l or q is greater than n/2. Specifically, the circuits 110 and 112 are configured:

- when the signal at the output of the comparator indicates that the fraction l or q (based on the current period) is greater than n/2 or the trigger signal (e.g., EOC_TMR) is not set, drive the multiplexer 1044 via the signal SEL3 in order to selected the value "1," whereby the accumulator 1040/1042 is increased in response to the clock signal CLK_TMR by "1"; and
- when the signal at the output of the comparator indicates that the fraction l or q (based on the current period) is smaller than n/2 and the trigger signal (e.g., EOC_TMR) is set, drive the multiplexer 1044 via the signal SEL3 in order to selected the value "2," whereby the accumulator 1040/1042 is increased in response to the clock signal CLK_TMR by "2."

Accordingly, substantially, the timer circuit 104 is configured to increase for one clock cycle of the signal CLK_TMR (i.e., a single cycle for each switch-on or switch-off period) the count value by two ("2") when the fraction l or q (based on the current period) is smaller than n/2.

Figure 11B:
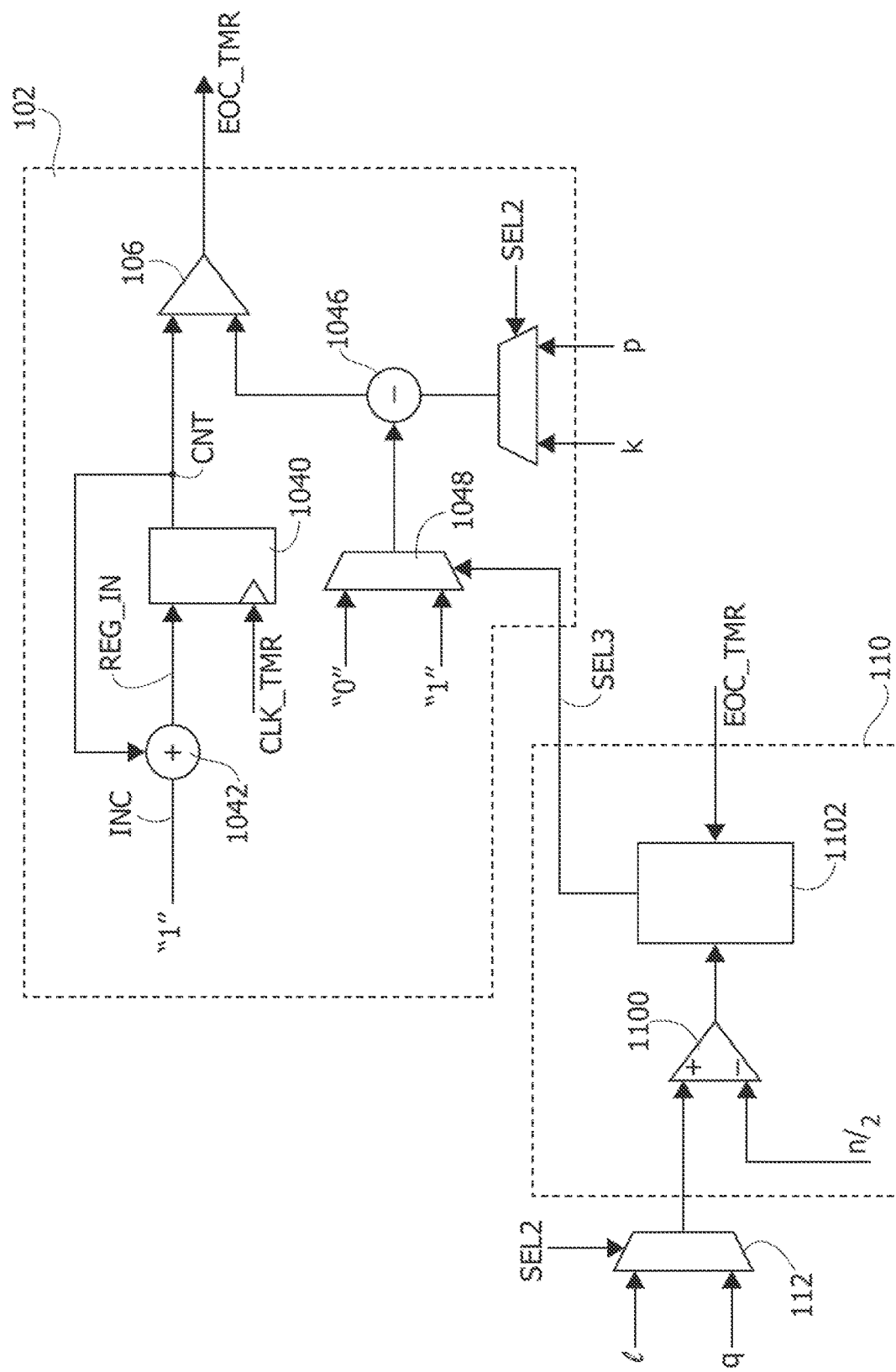

Conversely, FIG. 11B shows that a similar result may be obtained by adapting directly the threshold value used by the comparator 106.

Specifically, in the embodiment considered, the increment value INC is always set to "1," and an additional digital subtractor is provided which is configured, e.g., via a multiplexer 1048, to:

- subtract the value "1" from the current threshold selected by the multiplexer 108 (k or p); or
- maintain the threshold value, e.g., by subtracting the value "0" from the current threshold selected by the multiplexer 108 (k or p).

In general, the embodiments may also be combined, i.e., during a switch-on duration may be implemented either the "plus-two" mechanism (FIG. 11A) or the adaption of the threshold k (FIG. 11), and during a switch-off duration may be implemented either the "plus-two" mechanism or the adaption of the threshold p.

Accordingly, in the embodiments considered, the circuits 1100/1102 inform the timer circuit 102 that a counting edge has been missed or will be missed due to clock combination shown in FIG. 9B. This missing edge information (i.e., the signal SEL3) can be computed by the control circuit/phase accumulator machine 110/110' that controls the fine delay selection and generates the phase selection change SEL1 (indicative of the next clock phase to be used for fine tuning of PWM signal). In fact, if the new phase selection selects a clock having its rising edge appearing during the on-time of the running clock, the combined CLK_TMR will have a longer on-time and the edge of the next selected clock phase, used in the clock combination circuitry of FIG. 9B, will be missed. This happens if the phase selection change is smaller than the half of number of available phases i.e., this occurs when the respective fraction l or q is smaller than n/2 (e.g., $\lfloor 17/2 \rfloor = 8$).

Using this clock change property, the timer may be incremented by "1" or "2," or the threshold of the comparator 106 may be adapted with respect to this internal flag generated as shown in FIG. 11A or 11B.

In various embodiments, the PWM signal is switched in response to the next rising edge of the new clock phase, i.e., the selected clock phase $\phi_{0\_gtd} \ldots \phi_{n-1\_gtd}$ of the following switch-on or switch-off period. However, the PWM signal may also be changed in response to the rising edge of the trigger signal EOC_TMR in the case of a SEL1 signal generated in any appropriate instant during the given time slot/period.

For example, as shown in FIG. 8, the PWM signal generator circuit may comprise a toggle circuit 114 configured to generate the PWM signal as a function of the signals $\phi_{0\_gtd} \ldots \phi_{n-1\_gtd}$ and the trigger signal EOC_TMR.

Generally, any suitable circuit may be used to toggle the level of the PWM signal in response to the signal EOC_TMR (or EOC_TMRa and EOC_TMRb) and the new clock phase.

For example, FIG. 12A shows an embodiment of the toggle circuit 114. Specifically, the toggle circuit 114 comprise arising edged detector circuit. Specifically, in the embodiment considered, the toggle circuit comprises for each of the signals $\phi_{0\_gtd} \ldots \phi_{n-1\_gtd}$ a respective rising edge detector $1140_0 \ldots 1140_{n-1}$, which is enabled as a function of the signal EOC_TMR.

Specifically, as shown in FIGS. 12B, 12C and 12D, in response to the rising edge of the current clock phase (e.g., $\phi_{k\_gtd}$ in FIG. 12C), the signal EOC_TMR will be set after a brief delay. In response to the trigger in the signal EOC_TMR, the circuit 100' will switch to the new clock phase (e.g., $\phi_{x\_gtd}$ in FIG. 12C). Thus, no additional rising edge of the old clock signal (e.g., $\phi_{k\_gtd}$ in FIG. 12C) occurs. Thus, in response to the following rising edge in the new clock phase (e.g., $\phi_{x\_gtd}$ in FIG. 12C) the respective edge detector 1140 will set its output (e.g., to high), because also the signal EOC_TMR is still set.

Accordingly, in the embodiment considered, the output of the various rising edge detector $1140_0..1140_{n-1}$ may be connected to a combinational logic circuit, e.g., implementing a logic OR function (FIG. 12A shows schematically a logic OR gate OR4, that may correspond to the last OR gate of a chain of OR gates, e.g., comprising in cascade 6 OR gates having three inputs, 2 OR gates having 2 inputs and the OR gate OR4) for this purpose but, generally speaking, it can be implemented with a different number and topology of gates as a result of a different balancing process with respect to speed and to the number of clock phases), which generates at output a trigger signal TRIG indicating that the logic level of the PWM signal has to change.

Accordingly, in the embodiment considered, the signal TRIG may be used to drive a flip-flop FF1 in order to invert the output of the flip-flop FF1, wherein the PWM signal is generated as a function (and preferably corresponds to) the signal at the output of the flip-flop FF1.

For example, in the embodiment considered, the flip-flop FF1 is implemented with a D-type flip-flop, receiving at the data terminal D via an inverter INV1 the inverted output signal of the flip-flop FF1, thereby inverting the output of the flip-flop FF1 in response to the trigger signal TRIG.

The inventor has observed that the above described clock signal CLK_TMR may also be used to implement a (high resolution) chronometer, i.e., a timer circuit configured to generate a signal indicative of the time elapsed between a start event and a stop event.

Specifically, as described in the foregoing, PWM signals are often used to control the average value of a voltage or current. For example, PWM signals are often used in wireless battery chargers, switched mode power supplies (electronic converters), motor control and lighting. For example, a chronometer may be useful when the PWM signal is used to drive (e.g., via a half or full bridge) a resonant circuit comprising one or more inductances and capacitances, e.g., a LC resonant tank. For example, a typical application may be a wireless power transmitter, or an electronic converter. For example, in this application it may be useful to measure the time elapsed between the rising and/or falling edge of the PWM signal and a given event (generated in response to the rising or falling edge of the PWM signal). For example, the chronometer may measure the time elapsed between the rising edge of the PWM signal and the instant when a current flowing through a given component of the resonant tank or the voltage at a given component or node of the resonant tank reaches a given threshold value, e.g., the current flowing through or the voltage at one of the components of the LC resonant tank, such as the voltage at a ringing node of the LC resonant tank.

The inventor has observed that the above described coarse counter(s) 104 or 104a/104b and the phase signals $\phi_0 \ldots \phi_{n-1}$ may be used to capture, in response to a given asynchronous event, with high resolution the time information of the PWM signal generator circuit.

Specifically, in various embodiments, the chronometer circuit is configured to store, in response to such an asynchronous event, the time and/or the phase information in a coherent way (e.g., with respect to the rising or falling edge of the PWM signal and the n phases outgoing from the PLL), with high resolution, minimum latency and without metastability issues.

Specifically, in the previous embodiments, the counter(s) 104 or 104a/104b are controlled by an adaptive clock CLK_TMR corresponding to a single selected clock phase, and a different clock phase may be used for the next interval $T_{ON}$ or $T_{OFF}$, thereby applying a fine tuning. Thus, the chronometer should sample the time, e.g., in terms of number of clock cycles and the phase information.

Figure 13:
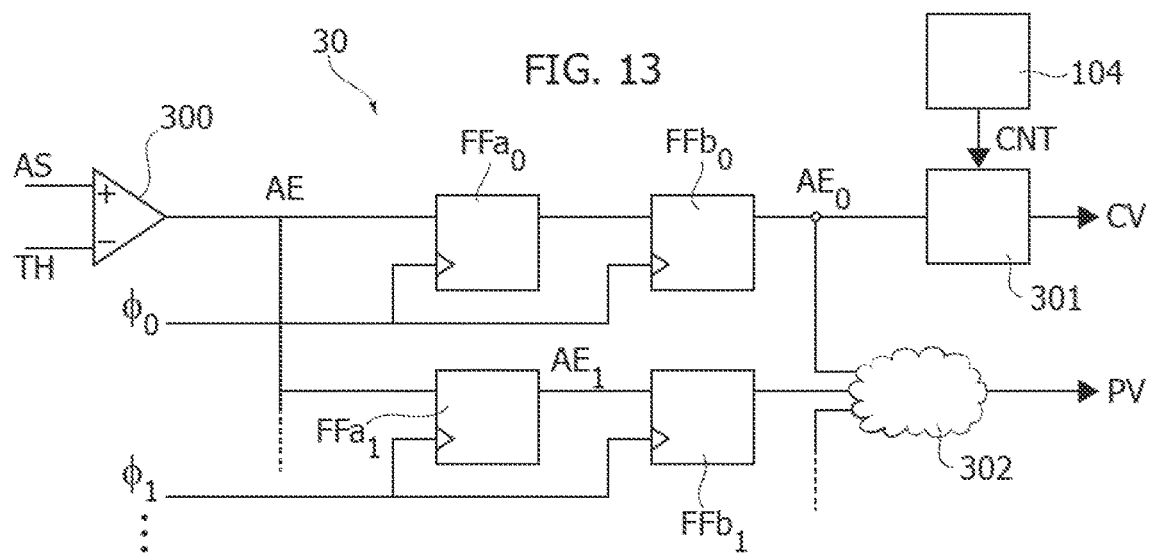
FIG. 13 shows an embodiment of a timer circuit configured to determine a sampled count value and sampled phase value in response to an asynchronous event.

FIG. 13 shows a first embodiment of a circuit 30 configured to determine a count value CV and a phase value PV in response to an asynchronous event, e.g., a rising (and/or falling) edge in a signal AE.

As mentioned before, such an asynchronous event signal AE may be generated via a comparator circuit 300 configured to compare an analog (voltage or current) signal with a respective threshold value TH.

Specifically, in the embodiment considered, the circuit 30 receives a plurality of phase signals $\phi_0 \ldots \phi_{n-1}$ and a count value CNT from a counter 104.

In the embodiment considered, the asynchronous event signal AE is sampled via a synchronization chain, e.g., implemented with two (or more) flip-flops FFa and FFb connected in cascade. Specifically, in the embodiment considered, the asynchronous event signal AE is sampled/synchronized with each of the phase signals $\phi_0 \ldots \phi_{n-1}$, i.e., the circuit 30 comprises for each phase signal $\phi_0 \ldots \phi_{n-1}$ a respective synchronization chain $FFa_0/FFb_0$, $FFa_1/FFb_1$, ... configured to sample the asynchronous event signal AE in response to a respective phase signal $\phi_0 \ldots \phi_{n-1}$, thereby generating respective sampled/synchronized versions $AE_0, AE_1, \ldots$ of the asynchronous event signal AE.

In the embodiment considered, one of the synchronized signals $AE_0, AE_1, \ldots$ (e.g., the signal $AE_0$) is provided to a register 301 in order to store the count value CNT of the counter 104 (or similarly the count value CNTa of the counter 104a or the count value CNTb of the counter 104b), thereby providing at output the count value CV.

Moreover, the various synchronized versions $AE_0$, $AE_1, \ldots$ are provided to a circuit 302, preferably a combinational logic circuit, which is configured to generate the phase value PV as a function of the (instantaneous) logic values of the synchronized signals $AE_0, AE_1, \ldots$.

However, the inventor has observed that storing separately the counter value CNT and the phase state (as indicated by the signals $AE_0, AE_1, \ldots$) may result in incorrect counter and phase pairing, e.g., due to metastability and different path timing. For example, even when using synchronization chains, the signals $AE_0, AE_1, \ldots$ have to be combined and the operation should be synchronized also with the clock signal CLK_TMR of the counter 104.

Figure 14:
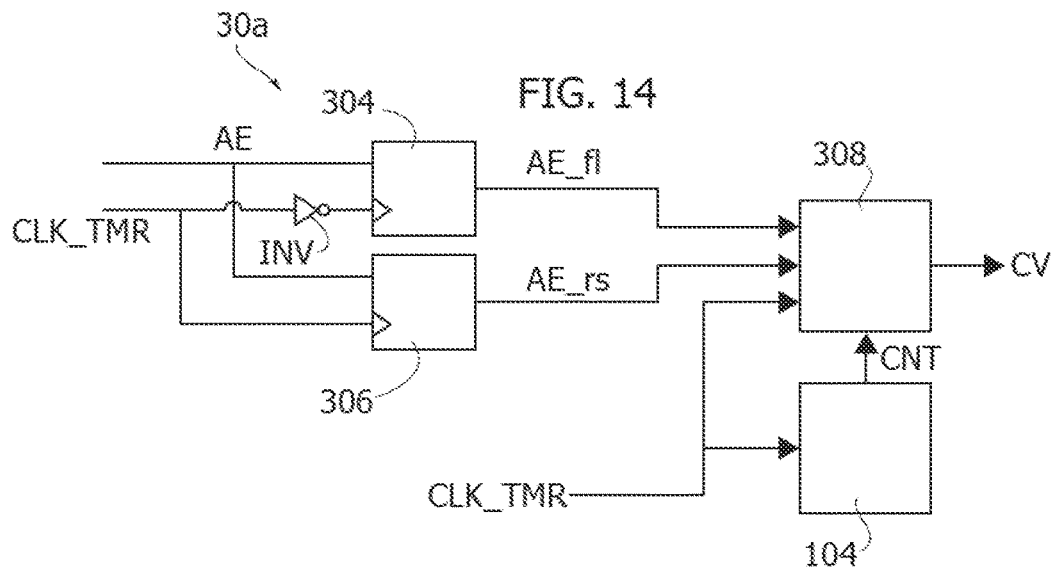
FIG. 14 shows an embodiment of a count value sampling circuit configured to determine a sampled count value in response to an asynchronous event.
Figure 19:
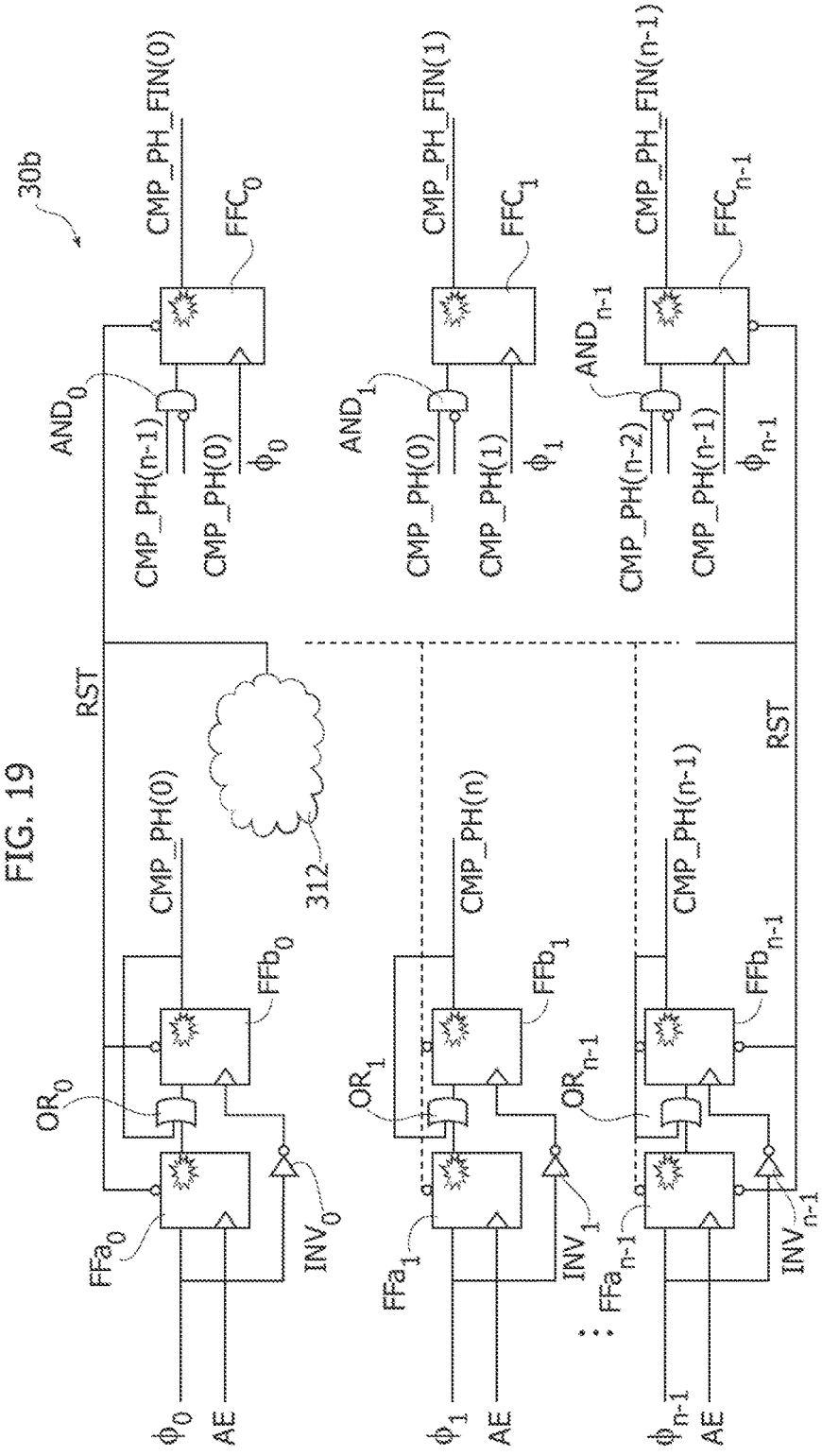

FIGS. 14 and 19 shows a second embodiment of a circuit configured to determine the count value CV and/or the phase value PV in response to an asynchronous event signal AE.

Specifically, FIG. 14 shows an embodiment of a circuit 30a configured to determine the count value CV.

Specifically, in the embodiment considered, the circuit 30a comprises two synchronization stages 304 and 306. For example, each of the synchronization stages 304 and 306 may be implemented with one or more flip-flops.

Specifically, in the embodiment considered, the synchronization stage/flip-flop 306 is configured to sample the asynchronous event signal AE at each rising edge of the clock signal CLK_TMR, e.g., the clock signal CLK_TMR is connected to the clock input of the synchronization stage/flip-flop 306, thereby generating a first synchronized event signal AE_rs, and the synchronization stage/flip-flop 304 is configured to sample the asynchronous event signal AE at each falling edge of the clock signal CLK_TMR, which is schematically shown by a inverter INV providing an inverted version of the clock signal CLK_TMR to the clock input of the synchronization stage/flip-flop 304, thereby generating a second synchronized event signal AE_fl.

For example, FIG. 16 shows an embodiment of a VHDL code of the two synchronization circuits 304 and 306.

Specifically, a process "p_async_fllng" models the behavior of the circuit 304 and a process "p_async_rsng" models the behavior of the circuit 304.

Generally, the process "p_async_fllng" is configured to assign to a signal ASYNCH_evnt_ret_fl (representing the signal AE_fl at the output of the circuit 304) the value of the signal CMP_ASYNCH_evnt (corresponding to the asynchronous event signal AE) in response to a falling edge of the clock signal CLK_TMR (indicated by the condition CLK_TMR'event and CLK_TMR='0'). Similarly, the process "p_async_rsng" is configured to assign to a signal ASYNCH_evnt_ret_rs (representing the signal AE_rs at the output of the circuit 306) the value of the signal CMP_ASYNCH_evnt (corresponding to the asynchronous event signal AE) in response to a rising edge of the clock signal CLK_TMR (indicated by the condition CLK_TMR'event and CLK_TMR='1').

In various embodiments, the circuits 304 and 306 may also support a reset operation. For example, in FIG. 16, the process "p_async_fllng" is configured to reset the signal ASYNCH_evnt_ret_fl when a signal s_rst_dump (representing the reset signal) is set. Similarly, the process "p_async_rsng" may be configured to reset the signal ASYNCH_evnt_ret_rs when the signal s_rst_dump is set.

In the embodiment shown in FIG. 14, the signals at the output of the synchronization stages/flip-flops 304 and 306 are provided to a sampling circuit 308 configured to store the count value CNT (or similarly CNTa/CNTb) of the counter 104 in response to the clock signal CLK_TMR also taking into account the logic values of the signals AE_rs/ASYNCH_evnt_ret_rs and AE_fl/ASYNCH_evnt_ret_fl.

In the embodiment considered, at least one of the signals AE_rs/ASYNCH_evnt_ret_rs and AE_fl/ASYNCH_evnt_ret_fl will be set by the circuits 304/306 when an asynchronous event AE is signaled.

Figure 15:
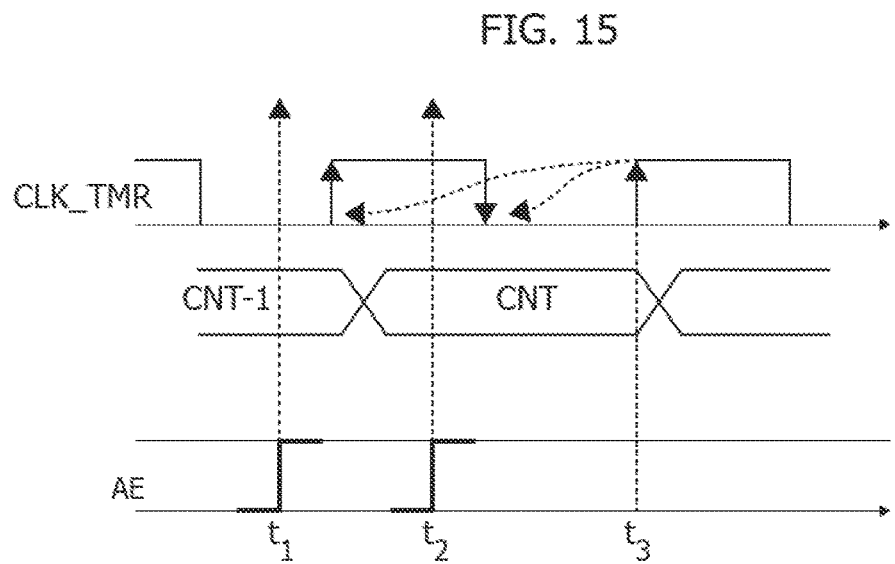

Specifically, as shown in FIG. 15, when the counter value CNT is increased at each rising edge of the clock signal CLK_TMR, a given delay exists until the counter value CNT changes.

Thus, when an asynchronous event AE occurs while the clock signal CLK_TMR is high (e.g., instant $t_2$ in FIG. 14), the signal AE_fl/ASYNCH_evnt_ret_fl will be set to high with the next falling edge of the clock signal CLK_TMR. Thus, when sampling the count value CNT at the next rising edge of the clock signal CLK_TMR, the signal AE_rs/ASYNCH_evnt_ret_rs will still be set to low (due to the intrinsic propagation delays).

Conversely, when an asynchronous reset AE occurs while the clock signal CLK_TMR is low (e.g., instant $t_1$ in FIG. 14), indeed the event occurs at a count value CNT−1 with respect to the instant $t_3$ when the count value is sampled. However, in this case, the signal AE_rs/ASYNCH_evnt_ret_rs will be set to high with the next rising edge of the clock signal CLK_TMR and the signal AE_fl/ASYNCH_evnt_ret_fl will be set to high with the next falling edge of the clock signal CLK_TMR. Thus, when sampling the count value CNT at the next rising edge of the clock signal CLK_TMR, the circuit 30a should indeed sample the value CNT−1.

Thus, in various embodiments, the circuit 30a is configured to:
 when the signal AE_rs/ASYNCH_evnt_ret_rs is low and the signal AE_fl/ASYNCH_evnt_ret_fl is high, sample the count value CNT, in response to the rising edge of the clock signal CLK_TMR; and
 when the signal AE_rs/ASYNCH_evnt_ret_rs is high and the signal AE_fl/ASYNCH_evnt_ret_fl is high, sample the count value CNT−1, in response to the rising edge of the clock signal CLK_TMR.

For example, FIG. 17 shows an embodiment of a VHDL code of the circuit 308, wherein a process "p_counter_dump" models the respective behavior.

For example, in the embodiment considered, in response to rising edge of the clock signal CLK_TMR (indicated by the condition CLK_TMR'event and CLK_TMR='1') the circuit 310 verifies the logic values of the signals ASYNCH_evnt_ret_rs (AE_rs) and ASYNCH_evnt_ret_fl (AE_fl). In case, the signals ASYNCH_evnt_ret_rs (AE_rs) and ASYNCH_evnt_ret_fl (AE_fl) are high, the circuit stores to a signal s_tmrcnt_dmp (representing the count value CT) the value TMR_CRS−1 (representing the value CNT−1). Conversely, the signal ASYNCH_evnt_ret_rs (AE_rs) is low and ASYNCH_evnt_ret_fl (AE_fl) is high, the circuit stores to a signal s_tmrcnt_dmp (representing the count value CV) the value TMR_CRS (CNT).

In various embodiments, the circuit 308 may also support a sample enable signal. For example, in FIG. 16, the process "p_counter_dump" is configured to store the value TMR_CRS−1 or TMR_CRS only when a sample enable signal s_end_dump has a given logic level (e.g., low, as indicated by the condition s_end_dump='0'). Moreover, once having stored the value TMR_CRS−1 or TMR_CRS, the logic value of this signal is inverted (e.g., high, as indicated by the operation s_end_dump<='1').

In various embodiments, the circuit 308 may be configured to reset the signals s_tmrcnt_dmp and s_end_dump when a signal s_rst_dump (representing again a reset signal) is set.

Thus, in various embodiments, the circuit 30a is configured to receive a clock signal CLK_TMR, such as the clock signal CLK_TMR described with respect to the PWM generator circuit of FIGS. 5 to 12, wherein this clock signal is used to increase a counter 104. A first synchronization circuit 304 is used to synchronize/retime the asynchronous event signal AE in response to a falling edge of clock signal CLK_TMR, thereby generating a first signal AE_fl. A second synchronization circuit 306 is used to synchronize/retime the asynchronous event signal AE in response to a rising edge of clock signal CLK_TMR, thereby generating a first signal AE_rs.

A sampling circuit 308 elaborates the signals AE_fl and AE_rs, e.g., via a combinational logic circuit, to determine:
 whether an asynchronous event AE occurred; and
 based on the signals AE_fl and AE_rs, whether the asynchronous event AE occurred while the clock signal CLK_TMR was high or low.

In case, both signals AE_fl and AE_rs are high, the counter value CNT is stored as signal CV, and if only the signal AE_fl is high, the counter value CNT minus one (CNT−1) is stored as signal CV.

As mentioned before, FIG. 19 shows a circuit 30b configured to perform a phase detection/sampling.

In the embodiment considered, the circuit 30b comprises a first level of n flip flops $FFa_0..FFa_{n-1}$, wherein each of the flip flops $FFa_0..FFa_{n-1}$ is configured to sample a respective clock phase $\phi_0 \ldots \phi_{n-1}$ (i.e., the respective phase $\phi_i$, with $0 \le i \le (n-1)$, is applied to the data input of the flip-flop $FFa_i$) in response to the asynchronous event signal AE (i.e., the asynchronous event signal AE is applied to the clock input of the flip-flop $FFa_i$).

In the embodiment considered, the circuit 30b comprises a second level of n flip flops $FFb_0..FFb_{n-1}$, configured to store the signal at the output of a respective one of the flip-flops $FFa_0..FFa_{n-1}$ in response to the falling edge of the respective phase $\phi_0 \ldots \phi_{n-1}$, i.e., the output of a given flip-flop $FFa_i$ is applied/coupled to the data input of a respective flip-flop $FFb_i$ and the inverted version of the respective clock phase $\phi i$ (schematically shown via inverters $INV_0..INV_{n-1}$) is applied to the clock input of the flip-flop $FFb_1$, thereby generating respective signals CMP_PH(0) . . . CMP_PH(n−1) at the output of the flip-flops $FFb_0..FFb_{n-1}$.

Specifically, in various embodiments, the flip-flops $FFb_0..FFb_{n-1}$ are configured to store only the signal at the output of the respective flip-flop $FFa_0..FFa_{n-1}$, when the signal at the output of the respective flip-flop $FFa_0 \ldots FFa_{n-1}$ is high. Accordingly, once the signal at the output of a flip-flop $FFa_i$ is set to high, the output at the respective flip-flop $FFb_i$ is set to high in response to the next falling edge of the respective phase $\phi_i$, and the output of the flip-flop $FFb_i$ remains high also when the signal at the output of a flip-flop $FFa_i$ is set to low. For example, in FIG. 19 is shown schematically for this purpose for each flip-flop $FFb_0..FFb_{n-1}$ a respective logic OR gate $OR_0..OR_{n-1}$, wherein each logic OR gate $OR_i$ receives at input the signal at the output of the respective flip-flop $FFa_i$ and the signal at the output of the respective flip-flop $FFb_i$, and the output of the logic OR gate $OR_i$ is connected to the input of the respective flip-flop $FFb_i$.

In the embodiment considered, the circuit 30*b* comprises also a third level of n flip flops $FFc_0..FFc_{n-1}$, configured to store, in response to a rising edge of a respective phase $\phi_0 \ldots \phi_{n-1}$, the result of the comparison between two adjacent signals CMP_PH(0) . . . CMP_PH(n−1) at the output of the flip-flops $FFb_0..FFb_{n-1}$. Specifically, a given flip-flop $FFc_i$ receives at the clock input the respective phase $\phi_i$, and at the data input a comparison signal, and provides at output a respective signal CMP_PH_FIN(i).

Specifically, in the embodiment considered each comparison signal indicates whether the respective signal CMP_PH(i) is low (with $0 \leq i \leq n-1$), i.e., the inverted version INV(CMP_PH(i)) is high, and the respective signal CMP_PH(i−1) is high. Specifically, the first comparison signal is generated as a function of the signals CMP_PH(0) and CMP_PH(n−1). For example, the comparison signals may be generated via logic AND gates $AND_0..AND_{n-1}$, each logic and gate $AND_i$ receiving at input the signal CMP_PH(i−1) (or CMP_PH(n−1) when i=0) and the inverted version of the signal CMP_PH(i).

Thus, essentially, the first two stages FFa and FFb generate synchronization trigger signals CMP_PH(0) . . . CMP_PH(n), wherein
each flip flop $FFA_i$ samples, in response to a rising edge in the asynchronous event signal AE, a respective clock phase $\phi_i$; and
each flip flop $FFb_i$ sets it output to high when, in response to a falling edge in the respective clock phase $\phi_i$, the signal at the output of the respective flip flop $FFA_i$ of the first stage is high.

Conversely, the third stage FFc determines the phase value PV. Specifically, as shown in FIG. 18, when an asynchronous event AE is generated, there will be only one single set of adjacent clock phases, wherein the previous $\phi_{i-1}$ is high and the following $\phi_i$ is low. For example, considering the instant $t_1$, the clock phase $\phi_1$ is high and the clock phase $\phi_2$ is low. Thus, the third stage verifies for each index i the couple/set of signals CMP_PH(i−1) and CMP_PH(i), wherein the signal CMP_PH(i−1) is high and the signal CMP_PH(i) is low, wherein the value i represents the phase value PV. Specifically, in the embodiment considered, the third phase generates the signals CMP_PH_FIN(0) . . . CMP_PH_FIN(n−1), wherein only one of the signals CMP_PH_FIN(0) . . . CMP_PH_FIN(n−1) is set to high. Thus, essentially, the signals CMP_PH_FIN(0) . . . CMP_PH_FIN(n−1) represent a one-hot-encoding of the index i/phase value PV.

Generally, the first two stages may both introduce metastability, insofar as the asynchronous event signal AE and the clock phases $\phi_0 \ldots \phi_{n-1}$ are not synchronized. However, the comparison mechanism of the third stage is also useful to solve such potential metastability issues. In fact, by construction, only on one single channel CMP_PH(i) may have a metastability. Assuming a structure perfectly balanced, this metastable value is expected to be solved within half phase clock period thus arriving with the same logic value at the input of a pair of AND gates where it is effectively used thus allowing the last flip flop FFc level to store the correct value.

In the embodiment considered, the registers FFb and FFc work as a double edge synchronizer; in general, each of the synchronization chains $FFb_i$ and $FFc_i$ may be implemented also with more flip-flops connected in cascade.

In various embodiments, the registers FFa, FFb and FFc are configured to be reset in response to a reset signal RST, such as the previous mentioned signal s_rst_dump. Generally, such a reset signal RST/s_rst_dump may be generated by any suitable circuit 312, and essentially activates the detection of the next asynchronous event AE. For example, in the embodiment considered, the registers are reset in response to a falling edge of the signal RST.

As mentioned before, in various embodiments, the counter circuit 104 (or similarly 104*a* and 104*b*) may use an adaptive clock signal CLK_TMR as described in the foregoing, wherein this clock signal CLK_TMR corresponds (during a given time period, such as the switch-on duration $T_{ON}$ and/or the switch-off duration $T_{OFF}$) to one of the clock phases $\phi_0 \ldots \phi_{n-1}$.

Figure 20:
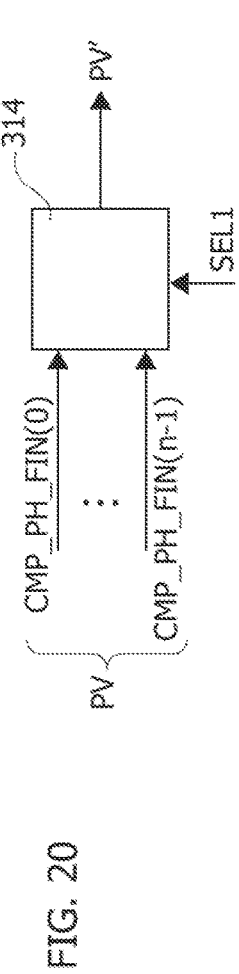

Thus, as shown in FIG. 20, the circuit 30 may comprises a circuit 314 configured to calculate a phase difference value PV' as a function of the clock phase $\phi_0 \ldots \phi_{n-1}$ used by the counter 104, e.g., as indicated by the selection signal SEL1, and the phase value PV detected by stage FFc.

Of course, without prejudice to the principle of the disclosure, the details of construction and the embodiments may vary widely with respect to what has been described and illustrated herein purely by way of example, without thereby departing from the scope of the present disclosure, as defined by the ensuing claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A time measurement circuit configured to generate a phase value, the time measurement circuit comprising:
a multiphase clock generator configured to generate a sequence of a given number n of phase shifted clock phases having a same clock period and being phase shifted by a time corresponding to a fraction 1/n of said clock period, wherein one of said phase shifted clock phases represents a reference clock signal;

a node configured to receive an asynchronous event signal;

a phase sampling circuit configured to generate said phase value, said phase value being indicative of a number of said fractions 1/n of said clock period elapsed between an edge of said reference clock signal and an instant when said asynchronous event signal is set.

2. The time measurement circuit according to claim 1, wherein said phase sampling circuit includes:
    a first sub-circuit including for each of said phase shifted clock phases a respective first flip-flop configured to, in response to said asynchronous event signal, sample the respective phase shifted clock phase, thereby determining a respective first control signal indicating whether the respective clock phase was set to high or low at the instant when said asynchronous event signal was set;
    a second sub-circuit including for each of said phase shifted clock phases a respective second flip-flop configured to, in response to the respective phase shifted clock phase, sample the respective first control signal, thereby determining a respective second control signal corresponding to a synchronized version of the respective first control signal;
    a third sub-circuit configured to:
        associate with each of said phase shifted clock phases a further clock phase, said further clock phase corresponding to the phase shifted clock phase of said sequence of phase shifted clock phases preceding the respective clock phase with said time;
        determine for each of said phase shifted clock phases a respective third control signal indicating whether:
            the second control signal associated with the respective phase shifted clock phase indicates that the respective phase shifted clock phase was set to low at the instant when said asynchronous event signal was set, and
            the second control signal associated with the respective further clock phase indicates that the respective further clock phase was set to high at the instant when said asynchronous event signal was set; and
    a fourth sub-circuit including for each of said phase shifted clock phases a respective third flip-flop configured to, in response to the respective phase shifted clock phase, sample the respective third control signal, thereby determining a respective fourth control signal corresponding to a synchronized version of the respective third control signal.

3. The time measurement circuit according to claim 2, wherein:
    each of said first flip-flops is configured to sample the respective phase shifted clock phase in response to a rising edge of said asynchronous event signal; and
    each of said second flip-flops is configured to sample the respective first control signal in response to a falling edge of the respective phase shifted clock phase.

4. The time measurement circuit according to claim 2, including for each of said phase shifted clock phases a respective logic OR gate configured to receive at input the respective first control signal provided by said respective first flip-flop and the respective second control signal provided by said respective second flip-flop, thereby determining a respective fifth control signal, and wherein each of said second flip-flops is configured to sample the respective fifth control signal, whereby each of said second flip-flops samples the respective first control signal only when the respective first control signal is set to high.

5. The time measurement circuit according to claim 2, wherein said third sub-circuit includes for each of said phase shifted clock phases a respective logic AND gate, each logic AND gate configured to receive at input an inverted version of the second control signal associated with the respective phase shifted clock phase, and the second control signal associated with the respective further clock phase, thereby generating the respective third control signal.

6. The time measurement circuit according to claim 2, wherein:
    each of said third flip-flops is configured to sample the respective third control signal in response to a rising edge of the respective phase shifted clock phase.

7. The time measurement circuit according to claim 2, wherein said first, second and third flip-flops are configured to be reset via a reset signal.

8. The time measurement circuit according to claim 2, wherein a further flip-flop is connected in cascade with each of said second or said third flip-flops.

9. The time measurement circuit according to claim 2, wherein said fourth control signals represents a one-hot encoding of said phase value.

10. The time measurement circuit according to claim 2, wherein said reference clock signal is selected among said phase shifted clock phases as a function of a selection signal, and wherein said phase value is determined as a function of said fourth control signals and said selection signal.

11. The time measurement circuit according to claim 1, comprising:
    a counter circuit configured to increase a count value in response to said reference clock signal; and
    a counter sampling circuit configured to generate a sampled count value by sampling said count value.

12. The time measurement circuit according to claim 11, wherein said counter sampling circuit comprises:
    a first sampling circuit configured to, in response to a rising edge of said reference clock signal, sample said asynchronous event signal, thereby generating a first synchronized asynchronous event signal;
    a second sampling circuit configured to, in response to a falling edge of said reference clock signal, sample said asynchronous event signal, thereby generating a second synchronized asynchronous event signal; and
    a sampling circuit configured to, in response to a rising edge of said reference clock signal, store either the count value of said counter circuit or the count value of said counter circuit decreased by one as a function of said first and said second synchronized asynchronous event signal, thereby generating said sampled count value.

13. A system, comprising:
    a time measurement circuit, including:
        a multiphase clock generator configured to generate a sequence of a given number n of phase shifted clock phases having a same clock period and being phase shifted by a time corresponding to a fraction 1/n of said clock period, wherein one of said phase shifted clock phases represents a reference clock signal;
        a node configured to receive an asynchronous event signal;
        a phase sampling circuit configured to generate a phase value, said phase value being indicative of a number of said fractions 1/n of said clock period elapsed between an edge of said reference clock signal and an instant when said asynchronous event signal is set;

a counter circuit configured to increase a count value in response to said reference clock signal; and a counter sampling circuit configured to generate a sampled count value by sampling said count value; and a Pulse-Width Modulated (PWM) signal generator circuit configured to generate a Pulse Width Modulated signal as a function of the count value of said counter circuit, wherein said sampled count value and said phase value are indicative of a number of clock cycles and the fractions 1/n of said reference clock signal elapsed between an edge of said Pulse-Width Modulated signal and the instant when said asynchronous event signal was set.

14. The system according to claim 13, wherein the phase sampling circuit includes:

a first sub-circuit including for each of said phase shifted clock phases a respective first flip-flop configured to, in response to said asynchronous event signal, sample the respective phase shifted clock phase, thereby determining a respective first control signal indicating whether the respective clock phase was set to high or low at the instant when said asynchronous event signal was set;

a second sub-circuit including for each of said phase shifted clock phases a respective second flip-flop configured to, in response to the respective phase shifted clock phase, sample the respective first control signal, thereby determining a respective second control signal corresponding to a synchronized version of the respective first control signal;

a third sub-circuit configured to:
associate with each of said phase shifted clock phases a further clock phase, said further clock phase corresponding to the phase shifted clock phase of said sequence of phase shifted clock phases preceding the respective clock phase with said time;

determine for each of said phase shifted clock phases a respective third control signal indicating whether:
the second control signal associated with the respective phase shifted clock phase indicates that the respective phase shifted clock phase was set to low at the instant when said asynchronous event signal was set, and the second control signal associated with the respective further clock phase indicates that the respective further clock phase was set to high at the instant when said asynchronous event signal was set; and a fourth sub-circuit including for each of said phase shifted clock phases a respective third flip-flop configured to, in response to the respective phase shifted clock phase, sample the respective third control signal, thereby determining a respective fourth control signal corresponding to a synchronized version of the respective third control signal.

15. The system according to claim 14, wherein the time measurement circuit includes:

a respective logic OR gate for each of said phase shifted clock phases, the OR gate configured to receive at input the respective first control signal provided by said respective first flip-flop and the respective second control signal provided by said respective second flip-flop, thereby determining a respective fifth control signal, and wherein each of said second flip-flops is configured to sample the respective fifth control signal, whereby each of said second flip-flops samples the respective first control signal only when the respective first control signal is set to high.

16. The system according to claim 14, wherein the third sub-circuit of the time measurement circuit includes:

a respective logic AND gate for each of said phase shifted clock phases, each logic AND gate configured to receive at input an inverted version of the second control signal associated with the respective phase shifted clock phase, and the second control signal associated with the respective further clock phase, thereby generating the respective third control signal.

17. An integrated circuit, comprising:
a time measurement circuit, including:
a multiphase clock generator configured to generate a sequence of a given number n of phase shifted clock phases having a same clock period and being phase shifted by a time corresponding to a fraction 1/n of said clock period, wherein one of said phase shifted clock phases represents a reference clock signal;

a node configured to receive an asynchronous event signal;

a phase sampling circuit configured to generate said a phase value, said phase value being indicative of a number of said fractions 1/n of said clock period elapsed between an edge of said reference clock signal and an instant when said asynchronous event signal is set.

18. The integrated circuit according to claim 17, wherein the phase sampling circuit includes:

a first sub-circuit including for each of said phase shifted clock phases a respective first flip-flop configured to, in response to said asynchronous event signal, sample the respective phase shifted clock phase, thereby determining a respective first control signal indicating whether the respective clock phase was set to high or low at the instant when said asynchronous event signal was set;

a second sub-circuit including for each of said phase shifted clock phases a respective second flip-flop configured to, in response to the respective phase shifted clock phase, sample the respective first control signal, thereby determining a respective second control signal corresponding to a synchronized version of the respective first control signal;

a third sub-circuit configured to:
associate with each of said phase shifted clock phases a further clock phase, said further clock phase corresponding to the phase shifted clock phase of said sequence of phase shifted clock phases preceding the respective clock phase with said time;

determine for each of said phase shifted clock phases a respective third control signal indicating whether:
the second control signal associated with the respective phase shifted clock phase indicates that the respective phase shifted clock phase was set to low at the instant when said asynchronous event signal was set, and
the second control signal associated with the respective further clock phase indicates that the respective further clock phase was set to high at the instant when said asynchronous event signal was set; and a fourth sub-circuit including for each of said phase shifted clock phases a respective third flip-flop configured to, in response to the respective phase shifted clock phase, sample the respective third control signal, thereby determining a respective fourth control signal corresponding to a synchronized version of the respective third control signal.

19. The integrated circuit of claim 17, wherein the time measurement circuit includes:
   a counter circuit configured to increase a count value in response to said reference clock signal; and
   a counter sampling circuit configured to generate a sampled count value by sampling said count value.

20. The integrated circuit of claim 19, further comprising:
   a Pulse-Width Modulated (PWM) signal generator circuit configured to generate a Pulse-Width Modulated signal as a function of the count value of said counter circuit,
   wherein said sampled count value and said phase value are indicative of a number of clock cycles and the fractions 1/n of said reference clock signal elapsed between an edge of said Pulse-Width Modulated signal and the instant when said asynchronous event signal was set.

* * * * *